(12) United States Patent
Honjo et al.

(10) Patent No.: US 7,238,540 B2
(45) Date of Patent: Jul. 3, 2007

(54) MAGNETIC RANDOM ACCESS MEMORY AND METHOD OF MANUFACTURING THE SAME

(75) Inventors: Hiroaki Honjo, Minato-ku (JP); Shinsaku Saitho, Minato-ku (JP)

(73) Assignee: NEC Corporation, Tokyo (JP)

( * ) Notice: Subject to any disclaimer, the term of this patent is extended or adjusted under 35 U.S.C. 154(b) by 299 days.

(21) Appl. No.: 10/873,269

(22) Filed: Jun. 23, 2004

(65) Prior Publication Data

US 2004/0257865 A1    Dec. 23, 2004

(30) Foreign Application Priority Data

Jun. 23, 2003   (JP)   ............... 2003-178340

(51) Int. Cl.
*H01L 21/00* (2006.01)
(52) U.S. Cl. .................. 438/3; 257/E43.001
(58) Field of Classification Search ........... 257/295, 257/421, 569
See application file for complete search history.

(56) References Cited

U.S. PATENT DOCUMENTS

| | | | |
|---|---|---|---|
| 6,233,172 B1 | 5/2001 | Chen et al. | |
| 6,252,796 B1 | 6/2001 | Lenssen et al. | |
| 6,292,389 B1* | 9/2001 | Chen et al. | 365/158 |
| 6,396,735 B2* | 5/2002 | Michijima et al. | 365/173 |
| 6,545,906 B1 | 4/2003 | Savtchenko et al. | |
| 6,714,446 B1 | 3/2004 | Engel | |
| 6,737,619 B2* | 5/2004 | Seghatol et al. | 219/679 |
| 6,737,691 B2 | 5/2004 | Asao | |
| 6,803,615 B1* | 10/2004 | Sin et al. | 257/295 |
| 6,944,049 B2 | 9/2005 | Hoenigschmid et al. | |
| 2005/0152180 A1 | 7/2005 | Katti | |

FOREIGN PATENT DOCUMENTS

| | | |
|---|---|---|
| EP | 1187103 A2 | 3/2002 |
| JP | 04-255905 A | 9/1992 |
| JP | 10-255231 A | 9/1998 |
| JP | 11-54814 | 2/1999 |
| JP | 11-161919 A | 6/1999 |
| JP | 2000-150984 | 5/2000 |
| JP | 2000-196165 | 7/2000 |

(Continued)

OTHER PUBLICATIONS

K. Tsuji, et al. "0.1μm-rule MRAM Development using Double-Layered Hard Mask" 2001 International Electron Devices Meeting Technical Digest, IEEE, 2001, pp. 799 to 802.

(Continued)

*Primary Examiner*—Walter Lindsay, Jr.
*Assistant Examiner*—Elias Ullah
(74) *Attorney, Agent, or Firm*—Sughrue Mion, PLLC

(57) ABSTRACT

A magnetic random access memory includes a substrate; a first ferromagnetic layer; a magnetic tunnel junction (MTJ) device provided on a same side of the substrate as the first ferromagnetic layer; and a wiring layer provided between the first ferromagnetic layer and the MTJ device. The MTJ device includes a second ferromagnetic layer opposing to the wiring layer. A first perpendicular projection of the first ferromagnetic layer on the substrate and a second perpendicular projection of the second ferromagnetic layer on the substrate are different in area, and one of the first and second perpendicular projections contains the other.

13 Claims, 23 Drawing Sheets

FOREIGN PATENT DOCUMENTS

| | | |
|---|---|---|
| JP | 2001-052316 A | 2/2001 |
| JP | 2002-124718 A | 4/2002 |
| JP | 2002-141583 A | 5/2002 |
| JP | 2002-158381 | 5/2002 |
| JP | 2002-176211 A | 6/2002 |
| JP | 2002-204002 A | 7/2002 |
| JP | 2003-86866 A | 3/2003 |
| JP | 2003-209226 A | 7/2003 |
| JP | 2003-258335 | 9/2003 |
| JP | 2004-119903 A | 4/2004 |

OTHER PUBLICATIONS

U.S. Appl. No. 10/496,827.

U.S. Appl. No. 11/208,370, by Kaoru Mori, et al., filed Aug. 19, 2005.

Development and process control of magnetic tunnel junctions for magnetic random access memory devices: J. Appl. Phys., vol. 93, No. 10, Part 2&3, 2003, p. 8373.

* cited by examiner

MAGNETIC RANDOM ACCESS MEMORY AND METHOD OF MANUFACTURING THE SAME

BACKGROUND OF THE INVENTION

1. Field of the Invention

The present invention relates to a magnetic random access memory (MRAM), and more particularly to a magnetic random access memory which uses a magnetic tunnel junction (MTJ) which shows a tunnel magnetic resistance effect (TMR effect) as a memory cell.

2. Description of the Related Art

The resistance of a magnetic tunnel junction (MTJ) which is composed of two ferromagnetic layers and a tunnel barrier layer (tunnel insulating layer) put between these ferromagnetic layers changes largely, depending on directions of the magnetizations of the ferromagnetic layers. Such a phenomenon is called a tunnel magnetic resistance effect (TMR effect). Therefore, by detecting the resistance of the magnetic tunnel junction, it is possible to determine the direction of the magnetization of the ferromagnetic layer.

The magneto-resistance device containing the magnetic tunnel junction (MTJ) device is applied to a magnetic random access memory (MRAM) which can hold data without being erased. In such an MRAM, memory cells each containing the MTJ devices are arranged in a matrix. The direction of the magnetization of one of the two ferromagnetic layers contained in the magnetic tunnel junction device is fixed (the ferromagnetic layer is called a pinned ferromagnetic layer) and the direction of the magnetization of the other is freely reversible (the ferromagnetic layer is called a free ferromagnetic layer). Data is stored as the direction of the magnetization of the free ferromagnetic layer. A data write operation is carried out by applying a current to the neighborhood of the magnetic tunnel junction device and reversing the direction of the magnetization of the free ferromagnetic layer by the magnetic field generated by the current. A data read operation is carried out by detecting the direction of the magnetization of the free ferromagnetic layer by using the TMR effect.

In the MRAM, it is demanded that the data write operation, i.e., the reversal to the direction of the magnetization can be carried out in as small current as possible. On the other hand, in order to hold data stably, it is preferable that the direction of the magnetization of the free ferromagnetic layer is stable to thermal disturbance. However, generally, these are contradictory. For example, the direction of the magnetization can be reversed in the small current if the coercive of the free ferromagnetic layer is made small, i.e., an anisotropic magnetic field of the free ferromagnetic layer is made small. In this case, however, the decrease of the anisotropic magnetic field is generally accompanied by the reduction of an energy barrier to reverse the direction of the magnetization of the free ferromagnetic layer. Therefore, when the anisotropic magnetic field is decreased, the stability in the MRAM data holding characteristic is lost.

U.S. Pat. No. 6,396,735A as a first conventional example discloses a conventional MRAM in which the reduction of the write current and the stabilization of the data holding characteristic are achieved at a same time. As shown in FIG. 1, the conventional MRAM is composed of a magnetic memory device 101a. The magnetic memory device 101a is composed of a wiring layer 128, an insulating layer 127, an anti-ferromagnetic layer 111, a pinned ferromagnetic layer 112, an insulating layer 113, a free ferromagnetic layer 114, a wiring layer 115 and a ferromagnetic layer 116. The pinned ferromagnetic layer 112 is composed of ferromagnetic layers 120 and 122 and a metal layer 121 put between them. As shown in FIG. 1, the wiring layer 115 extends in parallel to the substrate.

In the MRAM shown in FIG. 1, the data write operation is carried out by applying a write current to a direction parallel to the substrate through the wiring layer 115. When the write current flows through the wiring layer 115, a magnetic field is generated and applied to the second ferromagnetic layer 114 and the third ferromagnetic layer 116, and the directions of the magnetizations of the free ferromagnetic layer 114 and the ferromagnetic layer 116 are reversed. Because the directions of the magnetic fields applied to the free ferromagnetic layer 114 and the ferromagnetic layer 116 are opposite to each other, the directions of the magnetizations of the free ferromagnetic layer 114 and the ferromagnetic layer 116 are opposite. Because the distance between the free ferromagnetic layer 114 or ferromagnetic layer 116 and the wiring layer 115 is short, it is possible to reverse the direction of the magnetization in few currents.

On the other hand, because the free ferromagnetic layer 114 and the ferromagnetic layer 116 are magneto-statically combined and the directions of the magnetizations are opposite when a write current does not flows, the directions of the magnetizations of the free ferromagnetic layer 114 and the ferromagnetic layer 116S are stabilized to external disturbance. A technique similar to the first conventional example is disclosed in U.S. Pat. No. 6,252,796A.

When the data write operation is carried out by applying a current to the wiring layer 115 put in between the free ferromagnetic layer 114 and the ferromagnetic layer 116, how the wiring layer 115 is connected with a wiring line for supplying the write current is a problem. For solving this problem, it is necessary to provide the free ferromagnetic layer 114 near to the ferromagnetic layer 116, in order to magneto-statically combine the free ferromagnetic layer 114 and the ferromagnetic layer 116. Therefore, it is necessary to pattern the free ferromagnetic layer 114 and the ferromagnetic layer 116 so that the ends of them are approximately aligned. In this case, the wiring line for supplying the write current must be drawn out outside the free ferromagnetic layer 114 and the ferromagnetic layer 116 to connect with the wiring layer 115. Thus, conventionally, it is necessary to pattern the free ferromagnetic layer 114, the ferromagnetic layer 116 and the wiring layer 115 as a non-magnetic conductive layer separately, resulting in increase of the number of processes.

Also, there is a case that the ends of the free ferromagnetic layer 114 and the ferromagnetic layer 116 intersect due to an alignment difference. In such a case, the reversal of the direction of the magnetization cannot be smoothly carried out.

For these reasons, it could be considered that the ferromagnetic material 116 is patterned and then is embedded by an oxide film 124 for flattening, as shown in FIG. 2. By using this method, the end of the free ferromagnetic material 114 does not cover the end of the ferromagnetic material 116, because the ferromagnetic material 116 is embedded in the oxide film 124, even if the alignment difference is caused.

However, in this method, the flattening process gives damage to the ferromagnetic film 116. Moreover, it is necessary to provide a flattening stopper layer on the ferromagnetic layer 116. For this reason, if the distance between the free ferromagnetic layer 114 and the ferromagnetic layer 116 is made large, the magneto-statical combination and the exchange combination are weakened. As a result, the stability in the directions of the magnetizations of the free ferromagnetic layer 114 and the ferromagnetic layer 116 is lost in the non-write operation. Moreover, a manufacturing cost increases through the increase of the number of processes by the necessity of the flattening process.

Moreover, the alignment difference is caused through individual patterning of the free ferromagnetic layer 114 and the ferromagnetic layer 116. As a result, the magneto-statical combination between them is weakened and the reverse magnetic field of the free ferromagnetic layer 114 is deviated. Therefore, the value of the write current is deviated for every device.

In conjunction with the above description, a method of manufacturing a magnetic resistance effect head is disclosed in Japanese Laid Open Patent Application (JP-A-Heisei 4-255905). In this conventional example, an anti-ferromagnetic layer or a ferromagnetic layer is provided to direct contact a ferromagnetic magnetic resistance effect layer in order to generate a vertical bias magnetic field by exchange combination of the ferromagnetic magnetic resistance effect layer and the anti-ferromagnetic layer or ferromagnetic layer. Ion implantation is carried out a part of the anti-ferromagnetic layer or ferromagnetic layer.

Also, a magnetic resistance effect device is disclosed in Japanese Laid Open Patent Application (JP-A-Heisei 10-255231). The magnetic resistance effect device of this conventional example is composed of a ferromagnetic tunnel junction section and magnetic domain control films. The ferromagnetic tunnel junction section is a laminate film of a first ferromagnetic film, an insulating film and a second ferromagnetic film. The magnetic domain control films are provided at ends of one of the first and second ferromagnetic films.

Also, a magnetic tunnel junction device is disclosed in Japanese Laid Open Patent Application (JP-A-Heisei 11-161919). The magnetic tunnel junction device of this conventional example is composed of a pinned ferromagnetic multiplayer, a free ferromagnetic multiplayer, and an insulting tunnel layer. The pinned ferromagnetic multiplayer is composed of first and second ferromagnetic films and an anti-ferromagnetic film provided between the first and second ferromagnetic films to contact them. The first and second ferromagnetic films are anti-ferromagnetically combined with each other and have a magnetic moment fixed in a direction under an applied magnetic field. The free ferromagnetic multiplayer is composed of first and second ferromagnetic films and an anti-ferromagnetic film provided between the first and second ferromagnetic films to contact them. The first and second ferromagnetic films are anti-ferromagnetically combined with each other and have a magnetic moment reversible under an applied magnetic field. The insulting tunnel layer is provided between the pinned ferromagnetic multiplayer and the free ferromagnetic multiplayer to contact them, and allows a tunnel current between the pinned ferromagnetic multiplayer and the free ferromagnetic multiplayer.

Also, a magnetic resistance effect head is disclosed in Japanese Laid Open Patent Application (JP-P2001-52316A). The magnetic resistance effect head of this conventional example uses a ferromagnetic tunnel combination film which includes a free layer, a pinned layer, and a barrier layer formed between the free layer and the pinned layer. Oxide or nitride of metal material of the ferromagnetic tunnel combination film exists in a pattern of the he ferromagnetic tunnel combination film.

In addition, a magnetic resistance effect device is disclosed in Japanese Laid Open Patent Application (JP-P2002-176211A). The magnetic resistance effect device of this conventional example includes first and second magnetic layers, and a non-magnetic layer formed between the first and second magnetic layers. A current for sensing change in resistance based on change in an angle between a magnetization direction of the first magnetic layer and a magnetization direction of the second magnetic layer flows in a direction perpendicular to the surface of the each layer. The area of the non-magnetic layer is equal to or less than 1 $\mu m^2$. One selected from the first and second magnetic layers and the non-magnetic layer has a first region and a second region, and the area of the first region is smaller than the area of the non-magnetic layer. The current flows through the first region, and the second region is formed of oxide, nitride or oxidized nitride of material of the first region.

SUMMARY OF THE INVENTION

An object of the present invention is a magnetic random access memory (MRAM) and a manufacturing method of it, in which a deviation in device characteristic can be made small while the direction of the magnetization of a free ferromagnetic layer can be stabilized in case of a non-write operation.

Another object of the present invention is a magnetic random access memory (MRAM) and a manufacturing method of it, in which data can be written in a small write current.

Another object of the present invention is a magnetic random access memory (MRAM) and a manufacturing method of it, in which the MRAM can be manufactured in a low cost.

In an aspect of the present invention, a magnetic random access memory includes a substrate; a first ferromagnetic layer; a magnetic tunnel junction (MTJ) device provided on a same side of the substrate as the first ferromagnetic layer; and a wiring layer provided between the first ferromagnetic layer and the MTJ device. The MTJ device includes a second ferromagnetic layer opposing to the wiring layer. A first perpendicular projection of the first ferromagnetic layer on the substrate and a second perpendicular projection of the second ferromagnetic layer on the substrate are different in area, and one of the first and second perpendicular projections contains the other.

Here, when the first perpendicular projection is smaller in the area than the second perpendicular projection, a product of a thickness of the first ferromagnetic layer and a direction of a saturation magnetization of the first ferromagnetic layer is desirably larger than a product of a thickness of the second ferromagnetic layer and a direction of a saturation magnetization of the second ferromagnetic layer. When the first perpendicular projection is larger in the area than the second perpendicular projection, a product of a thickness of the first ferromagnetic layer and a direction of a saturation magnetization of the first ferromagnetic layer is desirably smaller than a product of a thickness of the second ferromagnetic layer and a direction of a saturation magnetization of the second ferromagnetic layer.

Also, the first ferromagnetic layer may be provided between the substrate and the MTJ device, or the MTJ device maybe provided between the substrate and the first ferromagnetic layer.

Also, the area of the first perpendicular projection is desirably larger than that of the second perpendicular projection.

Also, the second-ferromagnetic layer may be provided between the substrate and the first ferromagnetic layer, and at this time the second perpendicular projection is desirably larger in the area than the first perpendicular projection.

Also, at least one of the first ferromagnetic layer and the second ferromagnetic layer and a non-magnetic layer adjacent to the at least one ferromagnetic layer may form a substantially flat layer.

In another aspect of the present invention, a magnetic random access memory includes a substrate; a first ferromagnetic layer; a magnetic tunnel junction (MTJ) device provided on a same side of the substrate as the first ferromagnetic layer; and a wiring layer provided between the first ferromagnetic layer and the MTJ device. The MTJ device includes a second ferromagnetic layer opposing to the wiring layer. The first ferromagnetic layer and the first ferromagnetic layer are provided such that a magneto-static combination between them is made smaller than a magneto-static combination between them when a first perpendicular projection of the first ferromagnetic layer on the substrate and a second perpendicular projection of the second ferromagnetic layer on the substrate are substantially same.

Also, in another aspect of the present invention, a magnetic random access memory includes a substrate; a first ferromagnetic layer formed on the substrate; a wiring lead line formed on the first ferromagnetic layer; and a magnetic tunnel junction (MTJ) device formed on the wiring lead line on a position corresponding to the first ferromagnetic layer.

Here, an area of the first ferromagnetic layer in a cross section parallel to the substrate may be larger than an area of the magnetic tunnel junction device in a cross section parallel to the substrate.

Also, the magnetic tunnel junction device may include a second ferromagnetic layer connected with the wiring lead line. At this time, a side surface of the second ferromagnetic layer is connected with an oxide layer.

Also, a side surface of the first ferromagnetic layer may be connected with an oxide layer.

Also, in another aspect of the present invention, a magnetic random access memory includes a substrate; a magnetic tunnel junction (MTJ) device formed on the substrate; a wiring lead line formed on the magnetic tunnel junction device; and a first ferromagnetic layer formed on the wiring lead line on a position corresponding to the magnetic tunnel junction device.

Also, in another aspect of the present invention, a method of manufacturing a magnetic random access memory, is achieved by forming a first ferromagnetic film on a substrate; by forming a wiring lead line on the first ferromagnetic film; and by forming a magnetic tunnel junction device on the wiring lead line.

Here, the forming a magnetic tunnel junction device may be achieved by forming a second ferromagnetic film on the wiring lead line; by forming a tunnel barrier film on the second ferromagnetic film; by forming a pinned ferromagnetic film on the tunnel barrier film; and by patterning the tunnel barrier film and the pinned ferromagnetic film such that the magnetic tunnel junction device is formed above a position corresponding to the first ferromagnetic film. In this case, an area of the first ferromagnetic layer in a cross section parallel to the substrate is larger than an area of the magnetic tunnel junction device in a cross section parallel to the substrate. Also, the forming a magnetic tunnel junction device may be achieved by further oxidizing a portion of the second ferromagnetic film which is not covered by the patterned tunnel barrier layer.

Also, the forming a first ferromagnetic film may be achieved by depositing a first ferromagnetic layer; and by oxidizing a portion of the first ferromagnetic layer other than a predetermined portion.

In addition, in another aspect of the present invention, a method of manufacturing a magnetic random access memory, is achieved by forming a magnetic tunnel junction device on a substrate; by forming a wiring lead line on the magnetic tunnel junction device; and by forming a first ferromagnetic film on the wiring lead line.

Here, an area of the first ferromagnetic layer in a cross section parallel to the substrate is desirably smaller than an area of the magnetic tunnel junction device in a cross section parallel to the substrate.

DESCRIPTION OF THE PREFERRED EMBODIMENTS

Hereinafter, a magnetic random access memory (MRAM) and a method of manufacturing the same of the present invention will be described with reference to the attached drawings.

The present invention relates to a U.S. patent application Ser. No. 11/208,370 by K. MORI, T. SUZUKI, Y. FUKU-MOTO, and S. MIURA, titled "MAGNETIC MEMORY ADOPTING SYNTHETIC ANTIFERROMAGNET AS FREE MAGNETIC LAYER" and claiming priority based on Japanese patent Application No. JP 2004-240046. The disclosure of the U.S. Patent Application is incorporated herein by reference.

[First Embodiment]

Figure 1:
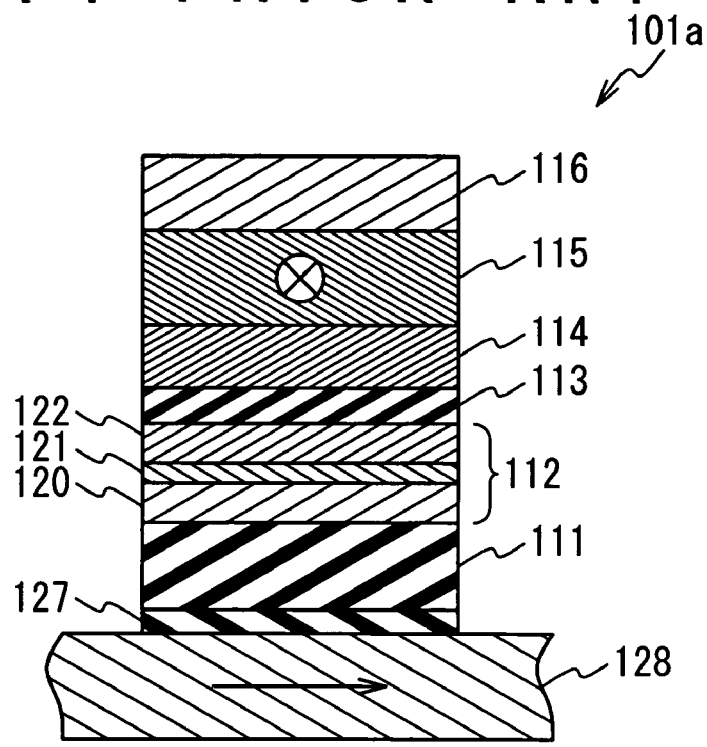
FIG. 1 is a cross sectional view showing a first conventional example of an MRAM.
Figure 2:
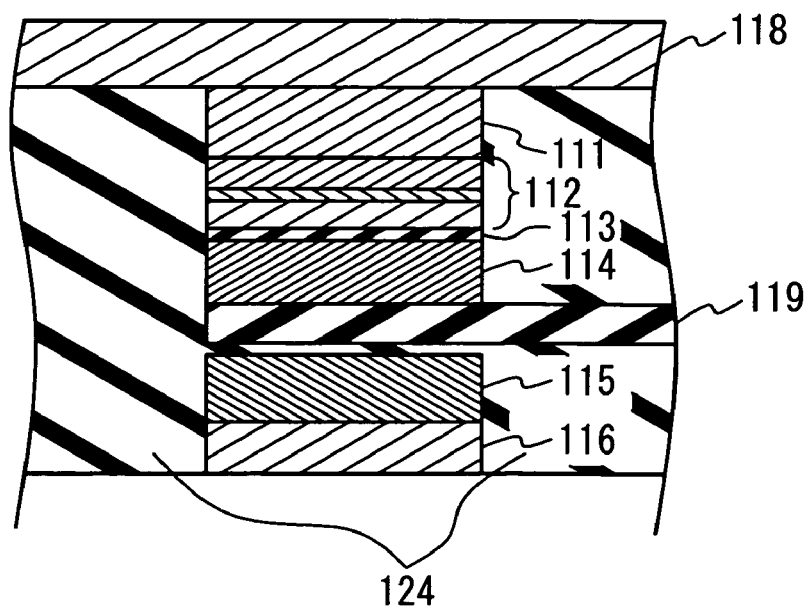
FIG. 2 is a cross sectional view showing a second conventional example of an MRAM.
Figure 3:
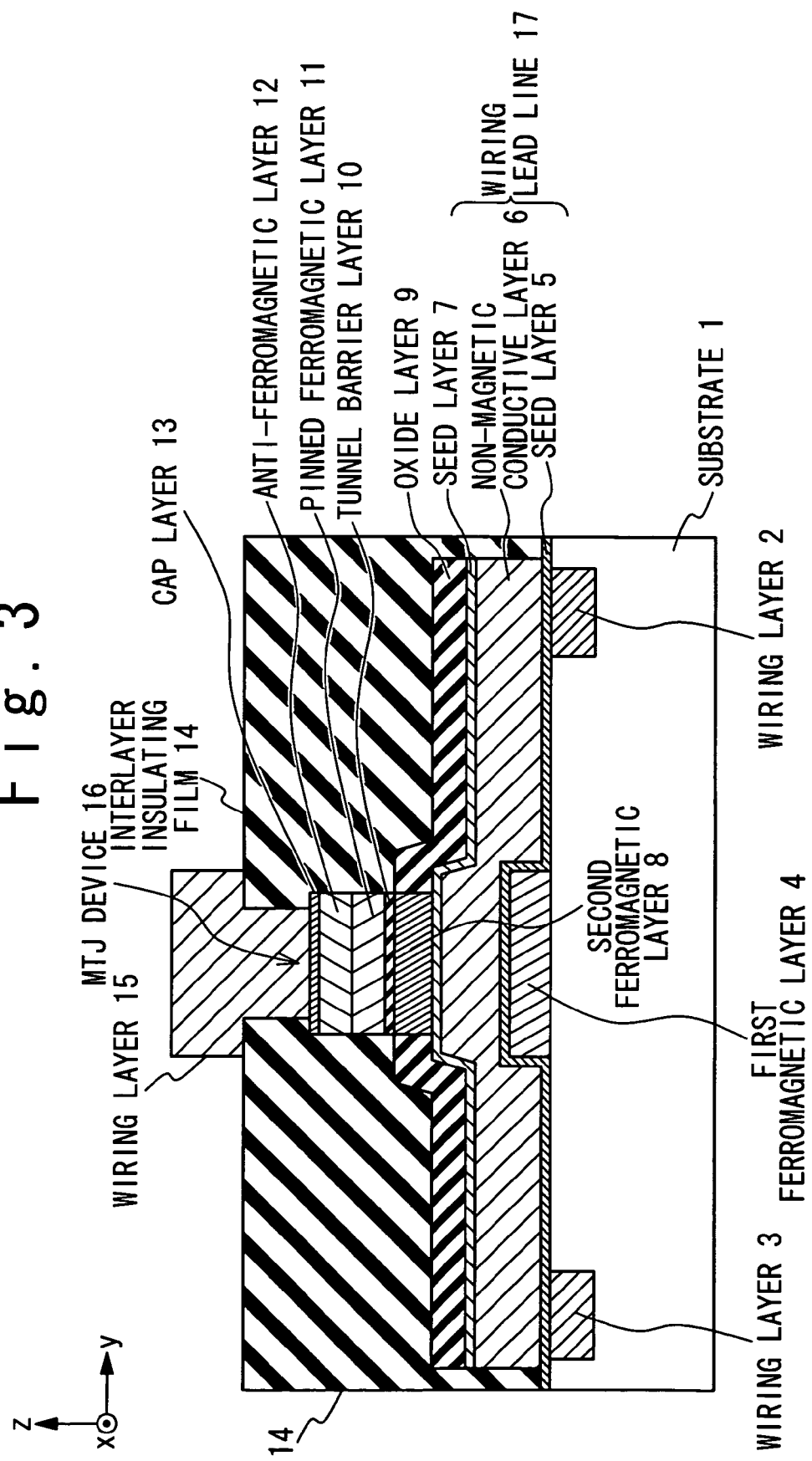
FIG. 3 is a cross sectional view showing the structure of an MRAM according to a first embodiment of the present invention.

Referring to FIG. 3, the MRAM according to the first embodiment of the present invention contains a substrate 1. Transistors (not shown) are formed on the substrate 1. A wiring layer 2 and a wiring layer 3 are provided in the substrate 1 to have a distance in a Y direction while being connected with the transistor. Supposing that a Z direction perpendicular to the substrate 1 is a positive direction, a first ferromagnetic layer 4 is formed on the positive side of the substrate 1. A wiring lead line 17 is provided to cross the first ferromagnetic layer 4. The wiring lead line 17 is connected with the wiring layers 2 and 3 which are provided in the substrates 1. The wiring lead line 17 contains a seed layer 5, a non-magnetic conductive layer 6 and a seed layer 7 in order from the side of the substrate 1. The seed layer 5 and the seed layer 7 are layers for improving fitness between the non-magnetic conductive film 6 and upper and lower layers as a diffusion barrier. The seed layers 5 and 7 are formed of a high melting point metal such as Ta, Ti, and TiW. There is a case that the seed layer 5 and the seed layer 7 are unnecessary, depending on material used for the non-magnetic conductive film 6.

A part of the write current flowing from the non-magnetic conductive layer 6 into a first ferromagnetic layer 4 and a second ferromagnetic layer 8 is wasteful because it does not contribute to reversal of the directions of the magnetizations of these ferromagnetic material layers 4 and 8. Therefore, it is desirable that the current flowing into the first ferromagnetic layer 4 and second ferromagnetic layer 8 is restrained. For this purpose, it is desirable to reduce the resistance of the non-magnetic conductive layer 6. The resistance value of a wiring line is in inverse proportion to the film thickness of the wiring line and is proportional to the resistivity of material to be used for the wiring line. Therefore, the resistance value of the non-magnetic conductive layer 6 can be reduced by forming the non-magnetic conductive layer 6 of the material of a small resistivity or by increasing the film thickness of the non-magnetic conductive layer 6. However, it is not desirable that the film thickness of the non-magnetic conductive layer 6 is made thick, because the distance between the first ferromagnetic layer 4 and the second ferromagnetic layer 8 is made large to weaken magnetic combination. Therefore, the material of a low resistance, such as Al, Cu, Pt, Au, and Ru is suitable as the material of the non-magnetic conductive layer 6.

The non-magnetic conductive layer 6 is interposed between the first ferromagnetic layer 4 and the second ferromagnetic layer 8. The non-magnetic conductive layer 6 is thin and the first ferromagnetic layer 4 and the second ferromagnetic layer 8 magneto-statically combine with each other. From the viewpoint of the stabilization of the magnetizations of the first ferromagnetic layer 4 and the second ferromagnetic layer 8, it is desirable that the non-magnetic conductive layer 6 is formed very thin to the extent that the first ferromagnetic layer 4 and the second ferromagnetic layer 8 are combined with each other through exchange interaction. However, it is not always needed that the non-magnetic conductive layer 6 is thin.

A magnetic tunnel junction (MTJ) device 16 is formed on the wiring lead line 17. The MTJ device 16 is formed slightly smaller in the area than the first ferromagnetic layer 4. The MTJ device 16 functions as a data-storage element of the memory cell of the MRAM. The side surface of the MTJ device 16 is covered by an interlayer insulating layer 14 so that the MTJ device 16 is isolated. Here, the "area" of a layer indicates a projected area when the layer is projected in the direction perpendicular to the substrate. The word "area" is used in the same meaning below.

The MTJ device 16 contains the second ferromagnetic layer 8, a tunnel barrier layer 10, a pinned ferromagnetic layer 11, and an anti-ferromagnetic layer 12 in order from the side of the substrate.

The first ferromagnetic layer 4 and the second ferromagnetic layer 8 are formed of relatively magnetically soft ferromagnetic material such as NiFe and NiFeCo. The directions of the magnetizations of the first ferromagnetic layer 4 and the second ferromagnetic layer 8 are opposite to each other. The directions of the magnetizations of the first ferromagnetic layer 4 and the second ferromagnetic layer 8 are reversed to the directions in accordance with data stored in the MTJ device 16.

In order to stabilize the directions of the magnetizations of the first ferromagnetic layer 4 and the second ferromagnetic layer 8 when a data write operation is not carried out, it is desirable that a quantity of magnetic fluxes generated from the first ferromagnetic layer 4 is substantially the same as a quantity of magnetic fluxes generated from the second ferromagnetic layer 8. The quantity of the magnetic fluxes becomes more when the area of the magnetic substance body is more. The quantity of the magnetic fluxes is proportional to a product to the film thickness of the ferromagnetic layer and the direction of the saturation magnetization. Therefore, it is desirable that a product of the film thickness of smaller one, in the area, of the second ferromagnetic layer 8 of the first ferromagnetic layer 4 and to the direction of the saturation magnetization is made as large as possible. That is, it is desirable that the following equation is satisfied when the area of the first ferromagnetic layer 4 is larger than that of the second ferromagnetic layer 8, $$Ms_2 t_2 > Ms_1 t_1$$

where $t_1$ is the film thickness of the first ferromagnetic layer 4, $Ms_1$ is the direction of the saturation magnetization, $t_2$ is the film thickness of the second ferromagnetic layer 8 and $Ms_2$ is the direction of the saturation magnetization. On the other hand, it is desirable that the following equation is satisfied when the area of the first ferromagnetic layer 4 is smaller than that of the second ferromagnetic layer 8.

$$Ms_1 t_1 > Ms_2 t_2$$

The tunnel barrier layer 10 is formed of non-magnetic insulator such as aluminum oxide. The tunnel barrier layer 10 is thin to the extent that the tunnel current flows into the film thickness direction, i.e., into the direction perpendicular to the surface of the tunnel barrier layer 10, and the thickness is typically in a range of 1.2 to 2.0 nm. The pinned ferromagnetic layer 11 is a single layer film formed of material such as NiFe, CoFe, and NiFeCo or a laminate layer film of these materials. The direction of the magnetization of the pinned ferromagnetic layer 11 is fixed by the exchange interaction received from the anti-ferromagnetic layer 12. The anti-ferromagnetic layer 12 is formed of anti-ferromagnetic material such as NiMn, FeMn, IrMn and PtMn.

The second ferromagnetic layer 8, the tunnel barrier layer 10 and the pinned ferromagnetic layer 11 constitutes the magnetic tunnel junction (MTJ) device. The resistance of the MTJ device changes in accordance with the direction of the magnetization of the second ferromagnetic layer 8 and the direction of the magnetization of the pinned ferromagnetic layer 11. The data stored in the MTJ device 16 is determined based on the change of the resistance of the MTJ.

A cap layer 13 is formed on the MTJ device 16. The cap layer 13 is provided to protect the layers formed under it, i.e., the first ferromagnetic layer 4, the seed layer 5, the non-magnetic conductive layer 6, the seed layer 7, the second ferromagnetic layer 8 as a free ferromagnetic layer, the tunnel barrier layer 10, the pinned ferromagnetic layer 11 and the anti-ferromagnetic layer 12 from damage applied during a manufacturing process. The cap layer 13 is typically formed of Ta. The surface of the cap layer 13 is connected to the wiring layer 15 through a via-hole 19. The wiring layer 15 is grounded.

Figure 4:
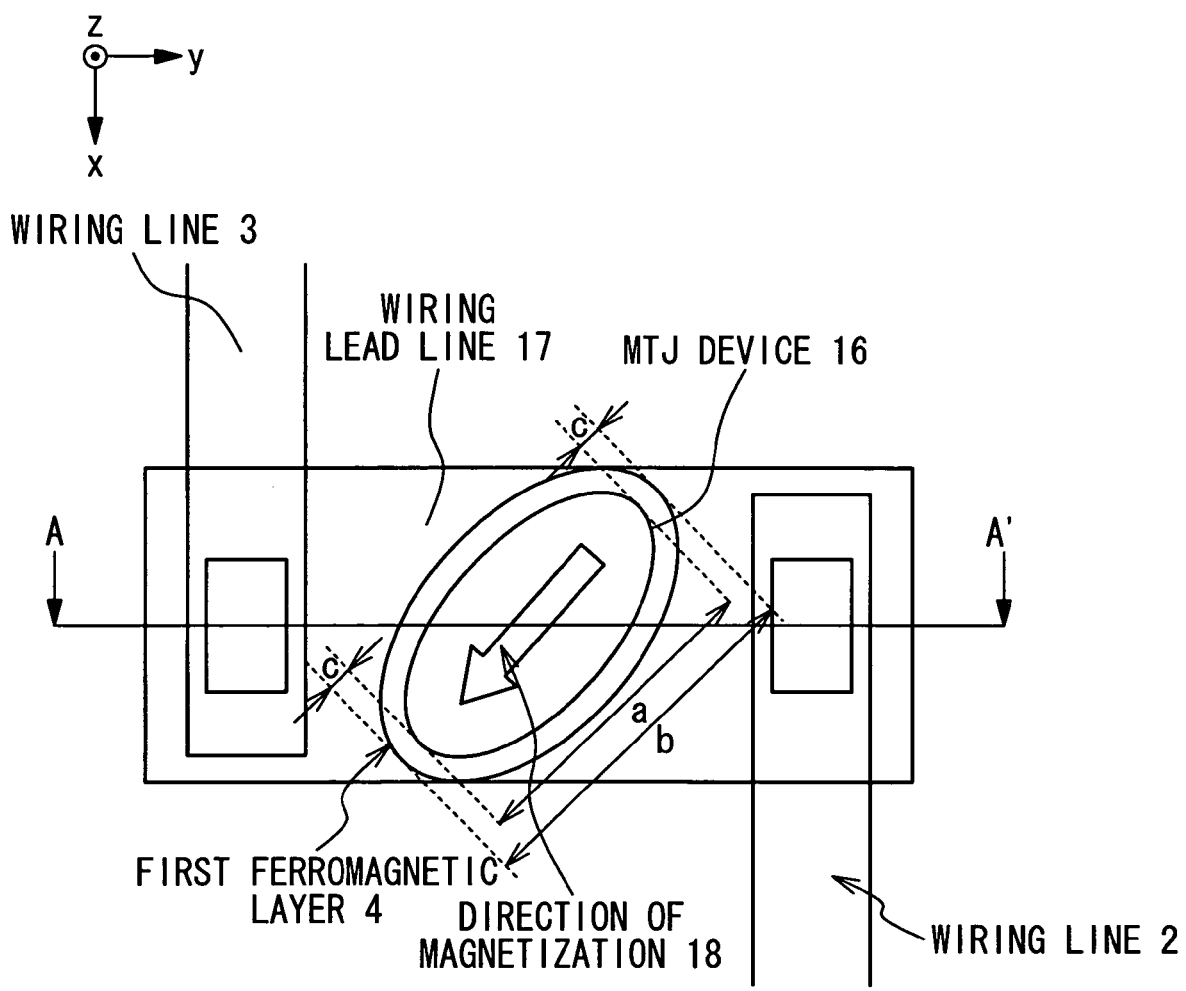
FIG. 4 is a plan view showing the MRAM according to the first embodiment of the present invention.

FIG. 4 shows a position relation of the first ferromagnetic layer 4 and the MTJ device 16 when the memory cell of the MRAM of the present invention is viewed from the Z direction. FIG. 3 is a cross sectional view of the MTJ device 16 along the A–A' line of FIG. 4. As shown in FIG. 4, the first ferromagnetic layer 4 is formed in a thin and long form in the X-Y plane to have the magnetization direction 18 tilted from the Y direction by 45 degrees. Thus, the first ferromagnetic layer 4 has a magnetic anisotropy with respect to the magnetization direction 18.

The MTJ device 1, opposes to the first ferromagnetic layer 4 to put the wiring lead line 17 between them. The MTJ device 16 is arranged on the position where the MTJ device 16 overlaps the first ferromagnetic layer 4, viewing from the Z direction, and the MTJ device 16 is analogous in shape to the first ferromagnetic layer 4, and is slightly smaller than the first ferromagnetic layer 4. That is, the area when the first ferromagnetic layer 4 is projected on the substrate 1 includes the area when the second ferromagnetic layer 8 is projected on the substrate 1. The second ferromagnetic layer 8 contained in the MTJ device 16 has a magnetic anisotropy in the magnetization direction 18. The direction of the magnetization of the pinned ferromagnetic layer 11 is fixed through the exchange interaction received from the anti-ferromagnetic layer 12.

It is not necessary that the center of the MTJ device 16 is coincident with the center of the first ferromagnetic layer 4, when the MTJ device 16 is viewed from the Z direction. However, it is desirable that the end or contour of the MTJ device 16 is inside the ends or contour of the first ferromagnetic layer 4. A distance c between the end of the first ferromagnetic layer 4 and the end of the MTJ device 16 is given by the following equation:

$$c=(b-a)/2$$

when the center of the MTJ device 16 is incident with the center of the first ferromagnetic layer 4, viewing the MTJ device 16 from the Z direction, where a is the length of a long side of the MTJ device 16, and b is the length of a long side of the first ferromagnetic layer 4.

In order to arrange the end of the MTJ device 16 inside the end of the first ferromagnetic layer 4, it is necessary that c is larger than the alignment precision d of the photolithography. Therefore, the values of a and b are determined based on the alignment precision d of the photolithography to satisfy c>d. The value of d depends on the performance of an exposure apparatus. As an example, d is in a range of 0.05 μm to 0.1 μm in i-line stepper.

Figure 5:
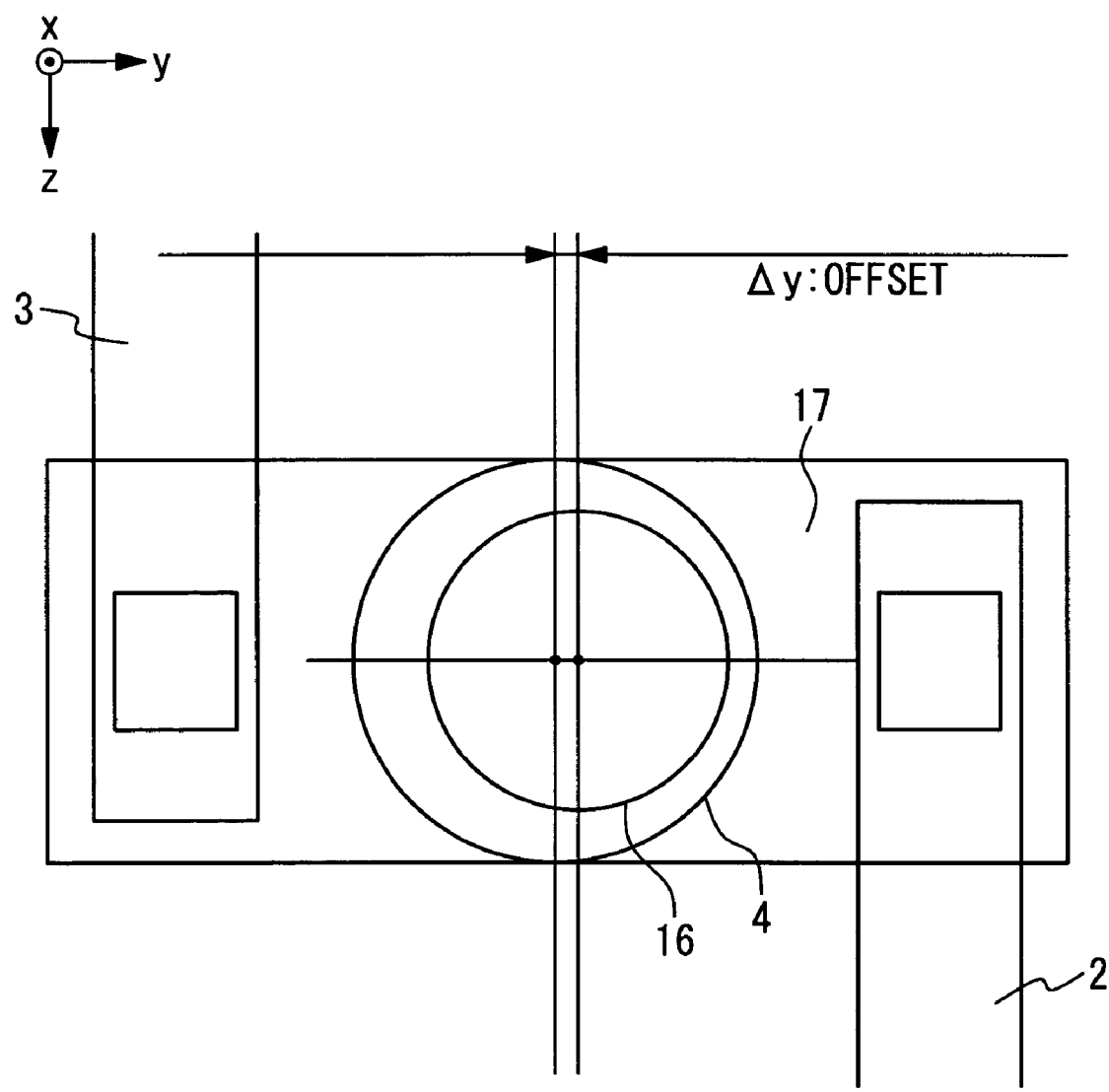
FIG. 5 is a plan view showing position relation between a first-ferromagnetic layer and an MTJ device in MRAM according to the first embodiment of the present invention.
Figure 6:
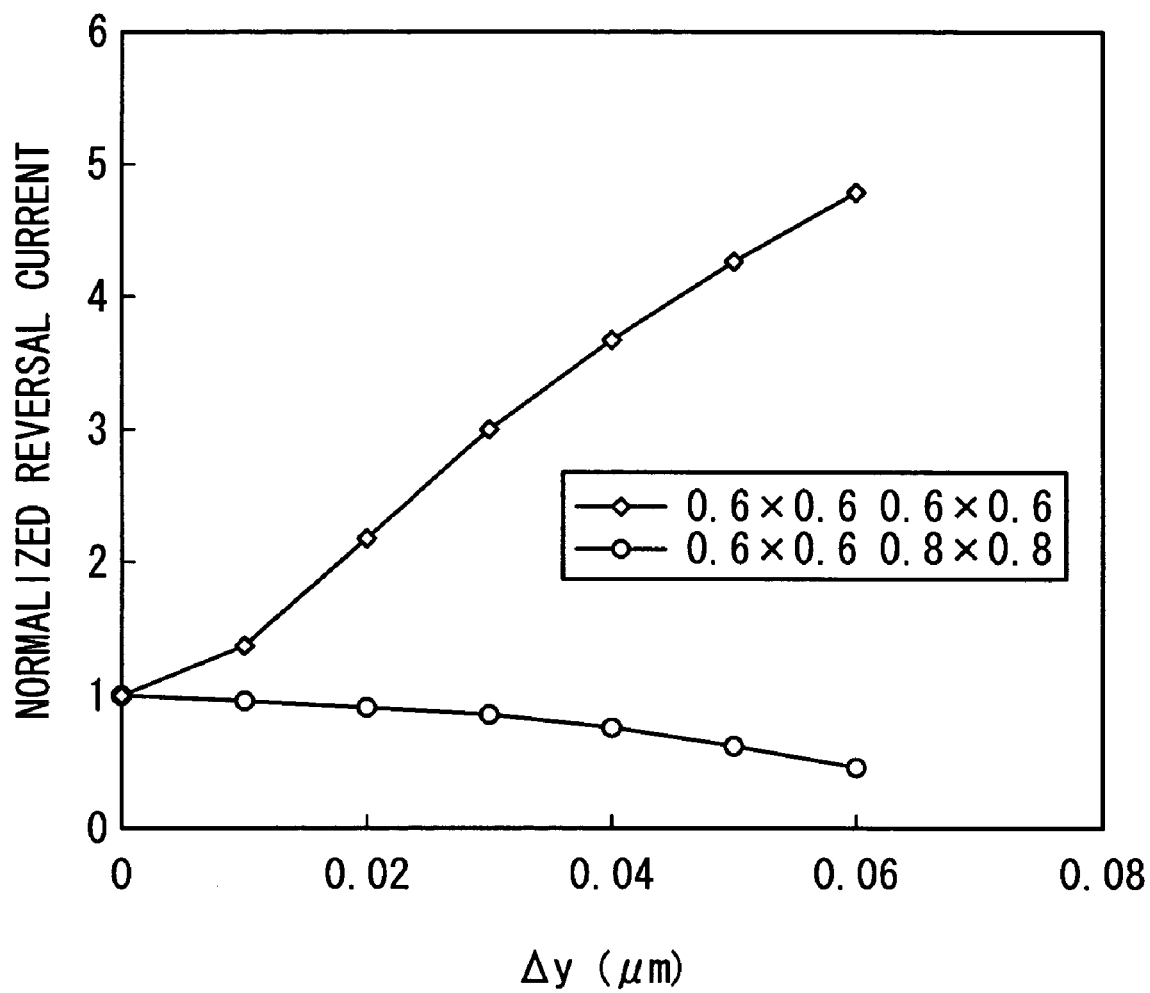
FIG. 6 is a graph showing relation between a position difference between the first ferromagnetic layer and the MTJ device and a reversal current in the MRAM according to the first embodiment of the present invention.

A deviation of write current caused based on an alignment difference in the manufacturing process is suppressed to a small value, because the area of the first ferromagnetic layer 4 and the area of the second ferromagnetic layer 8 are different. As shown in FIG. 5, the MTJ device 16 containing the second ferromagnetic layer 8 and the first ferromagnetic layer 4 are analogous in shape, viewing from the z direction. FIG. 6 shows a correlation between difference Δy and the write current (normalized reversal current) when the center of the MTJ device 16 and the center of the first ferromagnetic layer 4 are shifted by Δy. The upper curve in FIG. 6 shows a correlation between Δy and the reversal current when the first ferromagnetic layer 4 and the second ferromagnetic layer 8 have the same size as 0.6 μm×0.6 μm. In this case, the value of the write current is larger 3 times when the centers are separated by 0.03 μm, 5 times when the centers are separated by 0.06 μm, compared with a case where the center of the first ferromagnetic layer 4 and the center of the second ferromagnetic layer 8 are coincident with each other. The lower curve in FIG. 6 shows a correlation between Δy and the reversal current when the first ferromagnetic layer 4 has the size of 0.8 μm×0.8 μm and thee second ferromagnetic layer 8 has the size of 0.6 μm×0.6 μm. In this case, a change percentage of the reversal current to a change of the difference from the center is small. Therefore, when the area of the first ferromagnetic layer 4 is formed to be larger than the area of the second ferromagnetic layer 8, the deviation of the write current among the devices is effectively restrained.

In the MRAM of this embodiment, at least a MOS transistor is provided to supply the write current to each of the memory cells (the MTJ device 16). This is especially suitable when the structure is adopted in which a single write current is supplied to the write object memory cell. This structure is called a 1-axis write structure, hereinafter. The "supply of the single write current" means that two write currents flowing into different directions are not required to select the write object memory cell, unlike the conventional memory cell array. In the 1-axis write structure, because a magnetic field is applied to only the write object memory cell, the selectivity is very high. Moreover, in the 1-axis write structure, a large magnetic field can be applied to the write object memory cell, and the certainty of the write of data is high. However, in the 1-axis write structure, it is necessary to incorporate many MOS transistors into the memory cell array, and the size of the gate width of the MOS transistor is limited. The limitation on the gate width of the MOS transistor makes it difficult to supply a large write current to the memory cell. Therefore, the 1-axis write structure strongly requires the decrease of the write current. The MTJ device 16 of the present invention can decrease the write current and is especially suitable for the MRAM which adopts the 1-axis write structure.

Figure 7:
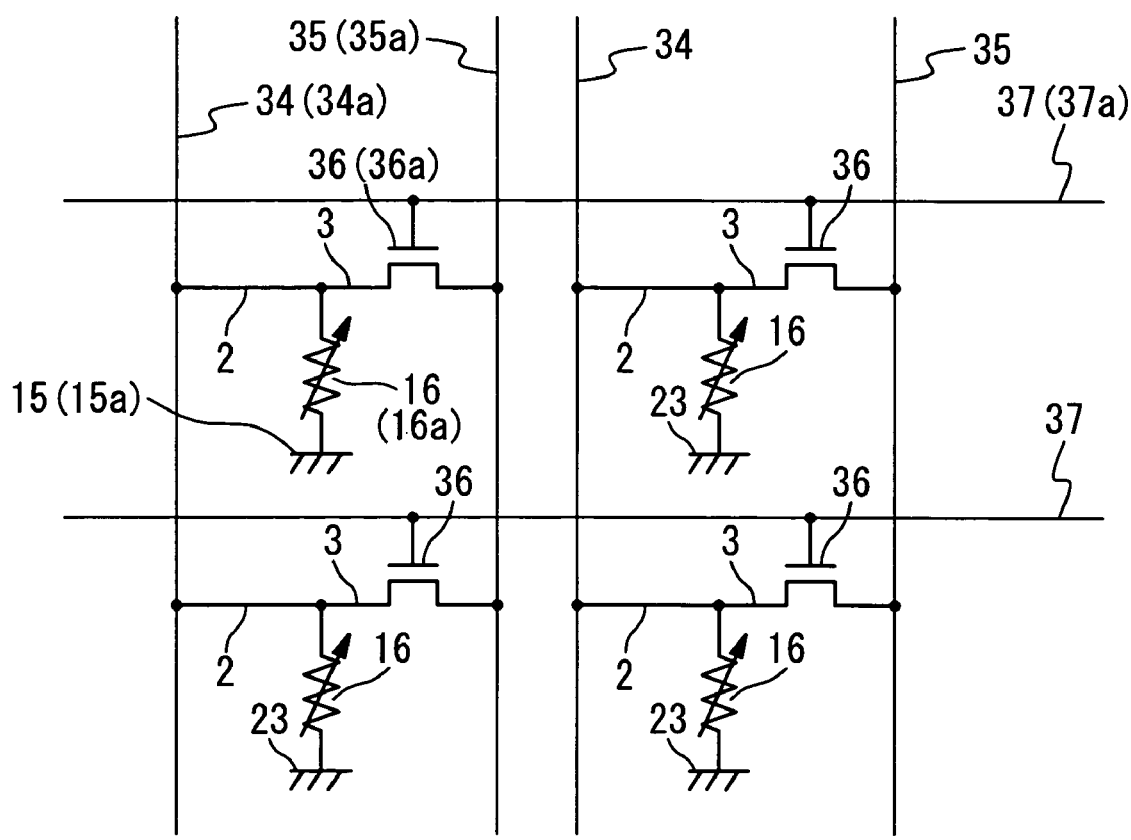
FIG. 7 is a circuit diagram showing the circuit configuration of the MRAM according to the first embodiment of the present invention.

FIG. 7 shows an example of the MRAM which adopts the 1-axis write structure. The MOS transistor 36 is provided for each of the MTJ devices 16. A wiring layer 2 is connected with a first bit line 34 and a wiring layer 3 is connected with a second bit line 35 through the MOS transistor 36. A word line 37 is connected with the gate of MOS transistor 36 to turn on and off.

The data write operation of MRAM of FIG. 7 is carried out as follows. First, one of the memory cells is selected. It is supposed below that the memory cell which contains the MTJ device 16a of FIG. 7 is selected. The word line 37 which is connected with the MOS transistor 36a is set to the high potential and the MOS transistor 36a connected with the MTJ device 16a is turned on. Moreover, the potential V1 is supplied to the first bit line 34a connected with the MTJ device 16a. A potential V2 (≠V1) is supplied to the second bit line 35a connected with the MTJ device 16a. The first bit lines 34, the second bit lines 35 and word lines 37 other than the above are set to the low potential. Thus, the write current flows through the wiring layer 2 and the wiring layer 3 connected with the MTJ device 16*a*. The directions of the magnetizations of the first ferromagnetic layer 4 and the second ferromagnetic layer 8 of the MTJ device 16*a* are reversed into a desired direction.

On the other hand, the data read operation in the MRAM shown in FIG. 7 is carried out as follows. First, one of the memory cells (the MTJ devices 16) is selected. It is supposed below that the MTJ device 16*a* of FIG. 7 is selected. The word line 37 connected with the MOS transistor 36*a* which is connected with the MTJ device 16*a* is set to the high potential so as to turn on the MOS transistor 36*a*. Moreover, the potential Vb is supplied to the second bit line 35*a* which is connected with the MTJ device 16*a*. All the first bit lines 34 other than the second bit line 35*a* are set to a high impedance state. Because the wiring layer 15 is grounded to be previously mentioned, the read current flows from the second bit line 35*a* through the MTJ device 16*a* and the wiring layer 15*a*. The data stored in the MTJ device 16*a* can be determined from the read current.

Figure 8:
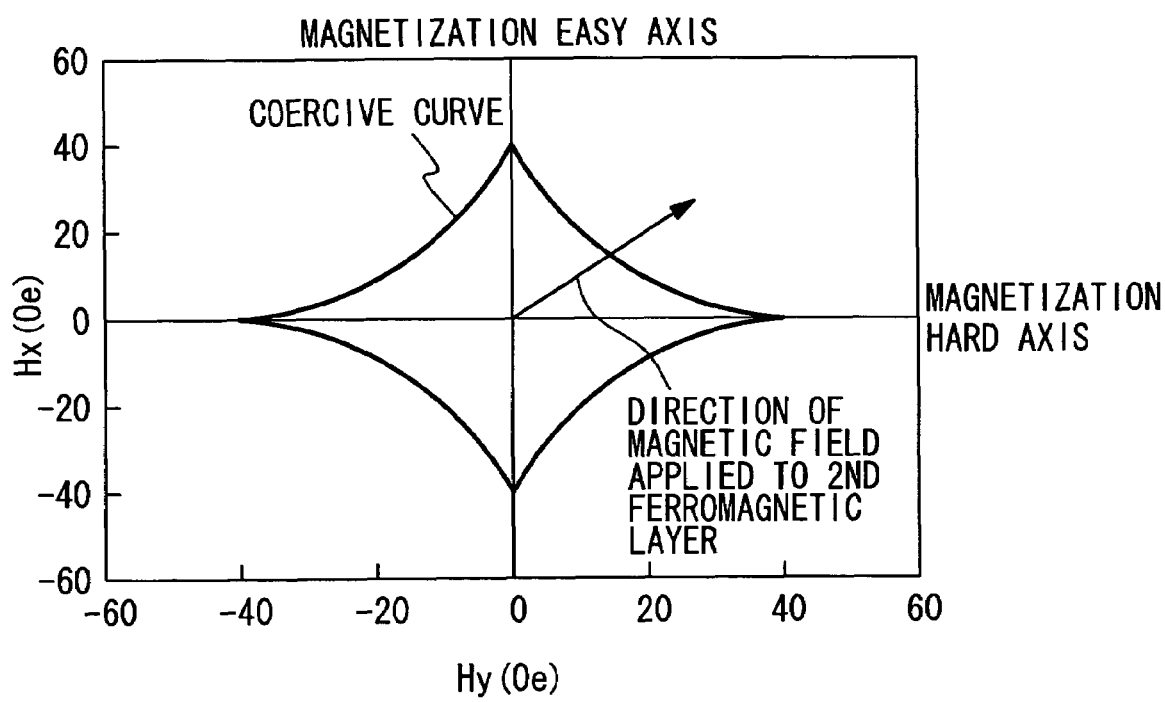
FIG. 8 is a diagram showing the direction of a magnetic field applied to a second ferromagnetic material.

As shown in FIG. 8, in this embodiment, it is effective to reduce the write current that flows into a direction diagonal to the direction of the easy axis of the first ferromagnetic layer 4 and the second ferromagnetic layer 8, viewing from a direction perpendicular to the substrate 1. In this way, as shown in FIG. 4, a magnetic field is applied to the diagonal direction to the easy axis of the first ferromagnetic layer 4 and the second ferromagnetic layer 8. As widely known to a person in the art, it is possible to reverse the directions of the magnetizations of the first ferromagnetic layer 4 and the second ferromagnetic layer 8 by the smaller magnetic field, by applying the magnetic field to the diagonal direction to the easy axis of the asteroid characteristic of the ferromagnetic material. Therefore, the write current can be made smaller, because the direction into which the write current flows is diagonal to the direction of the easy axis of the first ferromagnetic layer 4 and the second ferromagnetic layer 8.

When the above-mentioned 1-axis write structure is adopted, it is preferable that the direction into which the write current flows is substantially coincident with the direction perpendicular to the direction in which the coercive of the first ferromagnetic layer 4 and the second ferromagnetic layer 8 is the smallest, in their plane. At this time, the direction of the magnetic field generated by the write current is coincident with the direction in which the coercive of the first ferromagnetic layer 4 and the second ferromagnetic layer 8 is the smallest and the data can be written in the smaller write current.

The adoption of the 1-axis write structure is preferable in that it is easy to make the direction of the magnetic field generated by the write current coincide with the direction in which the coercive of the first ferromagnetic layer 4 and the second ferromagnetic layer 8 become the smallest. Conventionally, the data write operation into the MTJ device is carried out by supplying the write currents respectively to two orthogonal wiring lines and by generating a synthetic magnetic field in the direction diagonal to the direction of the easy axis of the free ferromagnetic layer. In this conventional method, however, it is necessary that the distance between the free ferromagnetic layer and the wiring line and the magnitude of the write current is optimized, in order to make the direction of the synthetic magnetic field coincide with the direction in which the coercive of the free ferromagnetic layer is the smallest. This imposes large restrictions to the magnitude of the write current. On the other hand, in the 1-axis write structure of this embodiment, it is possible to make the direction of the magnetic field generated by the write current coincide with the direction in which the coercive of the first ferromagnetic layer 4 and the second ferromagnetic layer 8 is the smallest, by arranging the wiring layer 2 and the wiring layer 3 in the appropriate positions. The optimization of the magnitude of the write current is not required.

Next, a method of manufacturing the MRAM in this embodiment will be described with reference to the drawings.

Figure 9A:
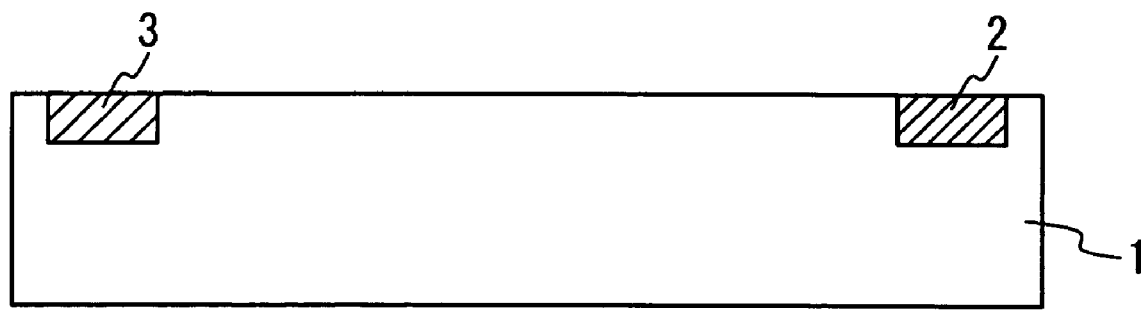
FIGS. 9A to 9I are cross sectional views showing the MRAM according to the first embodiment of the present invention in the manufacturing processes.

As shown in FIG. 9A, the wiring layer 2 and the wiring layer 3 are formed in the substrate 1 on which transistors (not illustrated) are formed. The wiring layer 2 and the wiring layer 3 are connected with the transistor formed on the substrate 1.

Figure 9B:
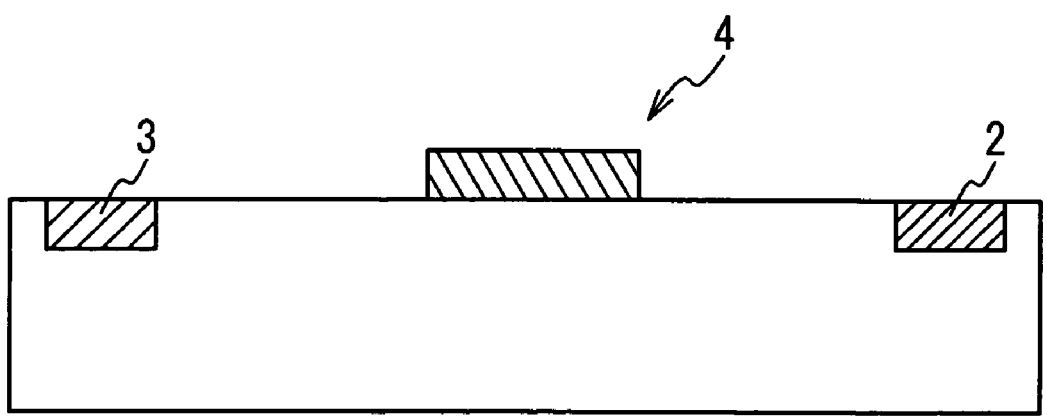
Figure 9C:
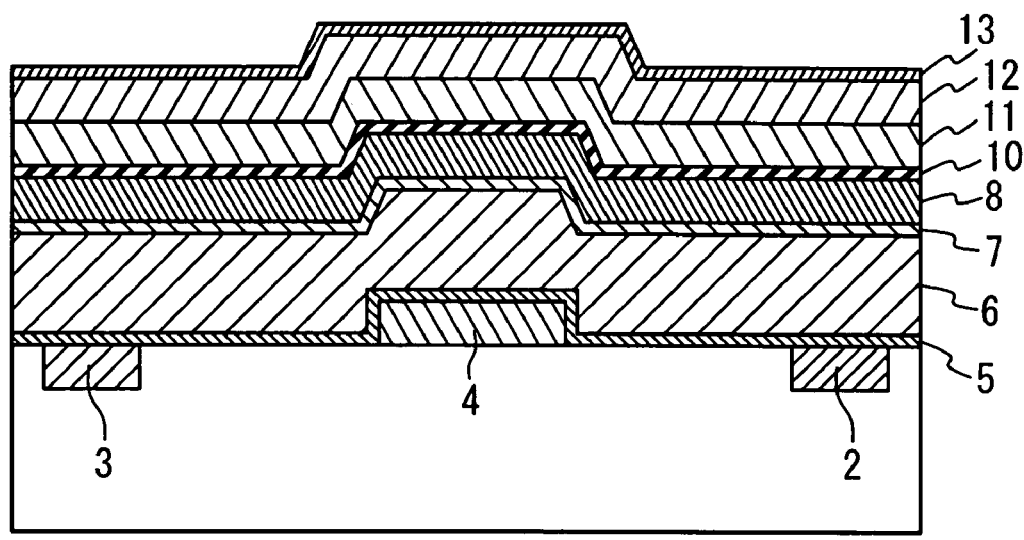

As shown in FIG. 9B, the first ferromagnetic layer 4 is deposited and patterned on the substrate 1. Subsequently, as shown in FIG. 9C, the seed layer 5 is formed to cover the surface of the patterned first ferromagnetic layer 4 and the substrate. On the seed layer 5, the non-magnetic conductive layer 6, the seed layer 7, the second ferromagnetic layer 8, the tunnel barrier layer 10, the pinned ferromagnetic layer 11, the anti-ferromagnetic layer 12 and the cap layer 13 are formed in order.

Figure 9D:
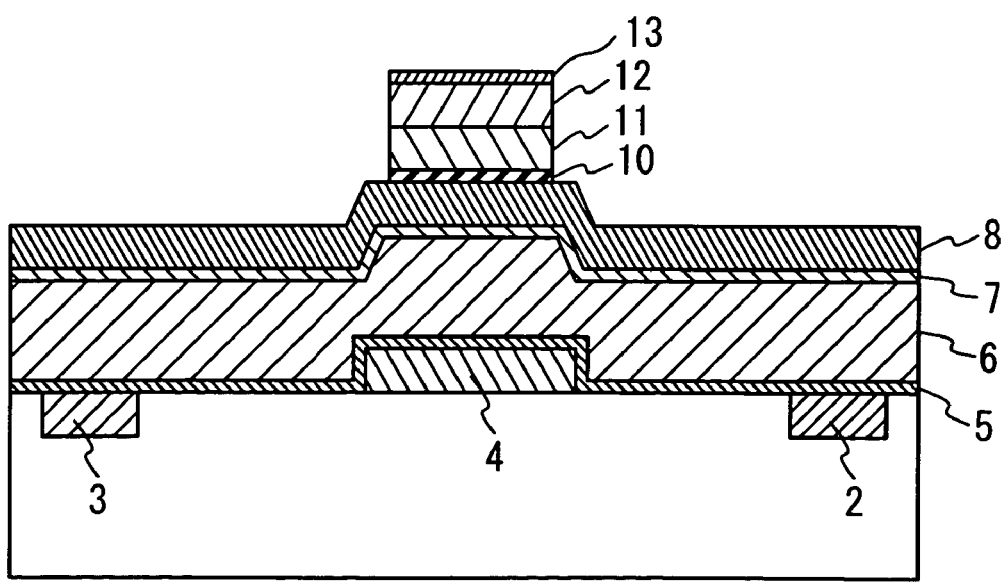

Next, as shown in FIG. 9D, a laminate layer of the tunnel barrier layer 10, the pinned ferromagnetic layer 11, the anti-ferromagnetic layer 12 and the cap layer 13 is patterned in such a manner that the area of the laminate layer in the cross section parallel to the substrate 1 is smaller than the area of the first magnetism layer 4 in the cross section parallel to the substrate 1. Because the cross section area of the MTJ device 16 is smaller than the cross section area of the first ferromagnetic layer 4, a margin in the patterning required to the MTJ device 16 becomes large. As a result, the MTJ device 16 can be formed without being stepped out from a protruding portion of the wiring lead line 17 corresponding to the first ferromagnetic layer 4. Therefore, the flattening process which is conventionally carried out to prevent the MTJ device 16 from stepping out from the upper portion of the first ferromagnetic layer 4 becomes unnecessary. As a result, the damage that is inflicted on the first ferromagnetic layer 4 reduces and the number of manufacturing processes decreases.

In order to prevent etched material from re-adhering to the side surface of the tunnel barrier layer 10 so that the second ferromagnetic layer 8 and the pinned ferromagnetic layer 11 forms a short-circuit when a physical etching such as an ion milling method is carried out, the etching is preferably stopped immediately when the tunnel barrier layer 10 has been etched. However, because the re-adhesion of the etched material can be prevented when a chemical etching such as an RIE (reactive ion etching) is carried out, it is not necessary to stop the etching immediately when the tunnel barrier layer 10 has been etched and the second ferromagnetic layer 8 may be etched.

Figure 9E:
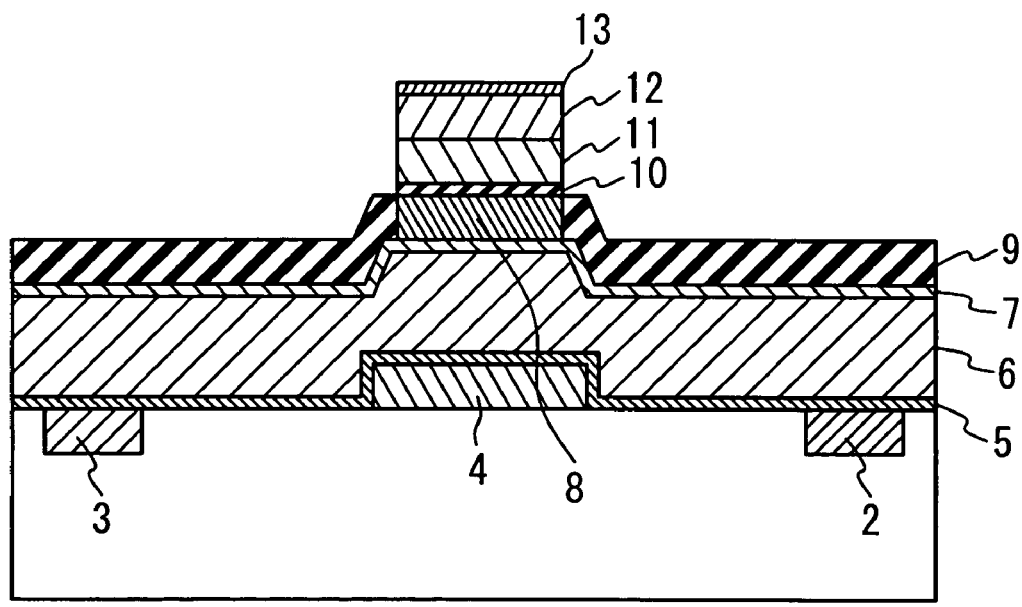

Next, as shown in FIG. 9E, when an etching is carried out to the tunnel barrier layer 10 by the ion milling method, a portion of the second ferromagnetic layer 8 which is not covered by the tunnel barrier layer 10 is oxidized by irradiating oxygen plasma or oxygen radicals to the substrate 1. As a result, the oxidized portion of the second ferromagnetic layer 8 is formed as an oxide layer 9. The second ferromagnetic layer 8 is a film which contains elements such as Ni, Fe, and Co. Because NiO, $Fe_2O_3$, and CoO as the oxides of these elements are anti-ferromagnetic material and do not output a magnetic flux. Therefore, even if these are left in the neighborhood of the MTJ device, there is no problem on the function. Moreover, because these oxides have the semiconductor characteristic at the room temperature, the resistance is relatively low. For example, the resistivity of the $Ni_{80}Fe_{20}$ film in the 10-nm thickness is about 20 μΩcm, and after the film is oxidized, the resistivity is as low as about 40 μΩcm. When the oxidized second ferromagnetic layer 9 is left without being etched, it may be used as a part of the wiring lead line 17. Thus, the film thickness of the non-magnetic conductive layer 6 can be made thin while restraining the rise of the resistance of the wiring line.

Figure 9F:
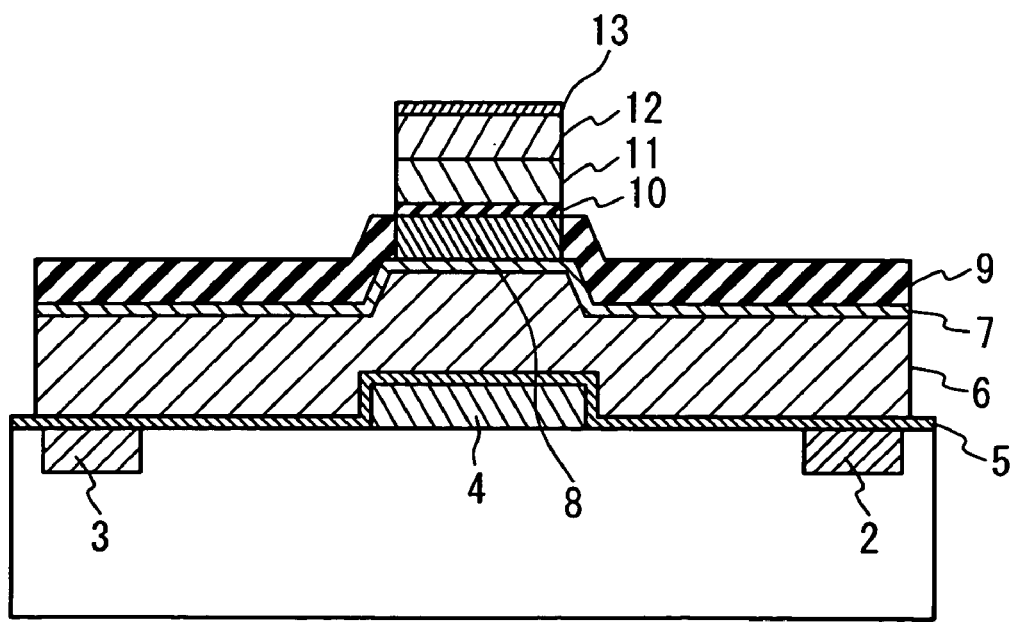

Next, as shown in FIG. 9F, the wiring lead line 17 is patterned into a specific shape. The wiring lead line 17 is patterned in the direction in which the reversal magnetic field of the MTJ device 16 is the smallest. That is, it is preferable that the wiring lead line 17 is formed in the direction of 45 degrees from the direction of the easy axis of the magnetization of the MTJ device 16, i.e., the direction 18 of the magnetization.

Figure 9G:
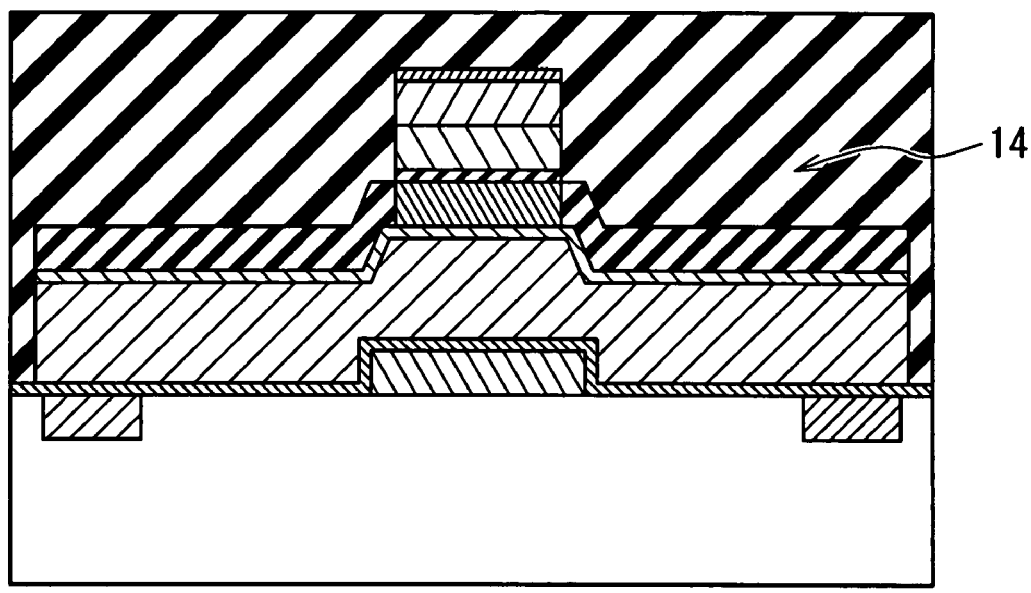
Figure 9H:
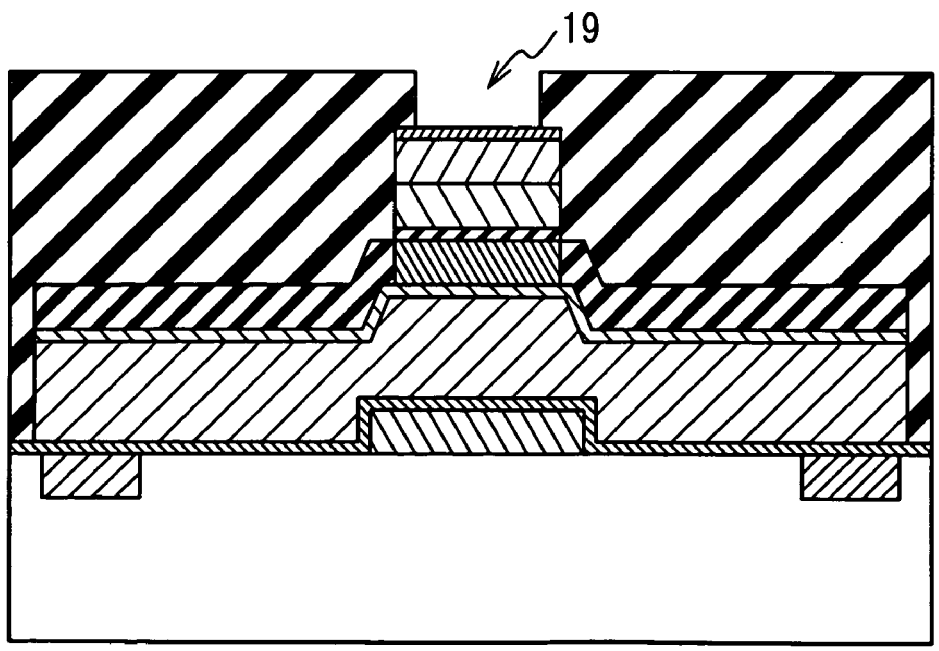
Figure 9I:
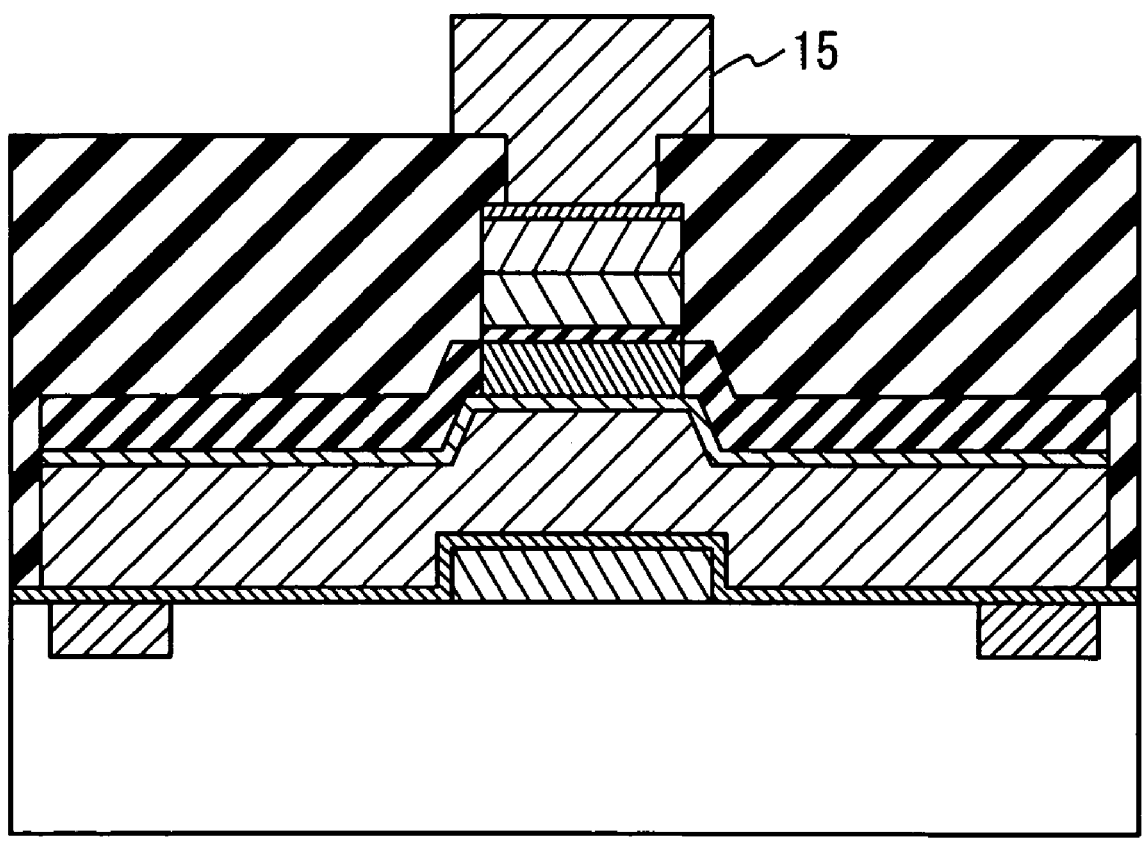

Next, as shown in FIG. 9G, the interlayer insulating film 14 is deposited. Subsequently, as shown in FIG. 9H, a through-hole 19 is formed in the interlayer insulating film 14 so that the cap layer 13 of the MTJ device 16 can be contacted from the outside of the interlayer insulating film 14. Subsequently, as shown in FIG. 9I, the wiring layer 15 is formed on the cap layer 13.

Through the above-mentioned manufacturing processes, the MRAM device can be manufactured in which deviation of the write currents is decreased.

As a modification of this embodiment, the MRAM of the present invention can be applied to the memory cell in which two write currents different in direction are supplied. In this case, the cross section of the MRAM is the same as the cross section shown in FIG. 3. The plan view of the MRAM is not always same as the plan view shown in FIG. 4. It is preferable that the MTJ device 16 is formed in such a manner that the direction 18 of the magnetizations of the first ferromagnetic layer 4 and the MTJ device 16 is diagonal to the direction of the synthetic magnetic field of the magnetic fields generated by two write currents, e.g., is a direction of 45 degrees from the direction of the synthetic magnetic field. In such an MRAM, the area of the first ferromagnetic layer 4 and the area of the second ferromagnetic layer 8 are different, like the 1-axis write structure. Therefore, the deviation among the devices in the write current can be effectively restrained. Moreover, the same effect as in the 1-axis write structure can be achieved in the manufacturing method.

[Second Embodiment]

Figure 10:
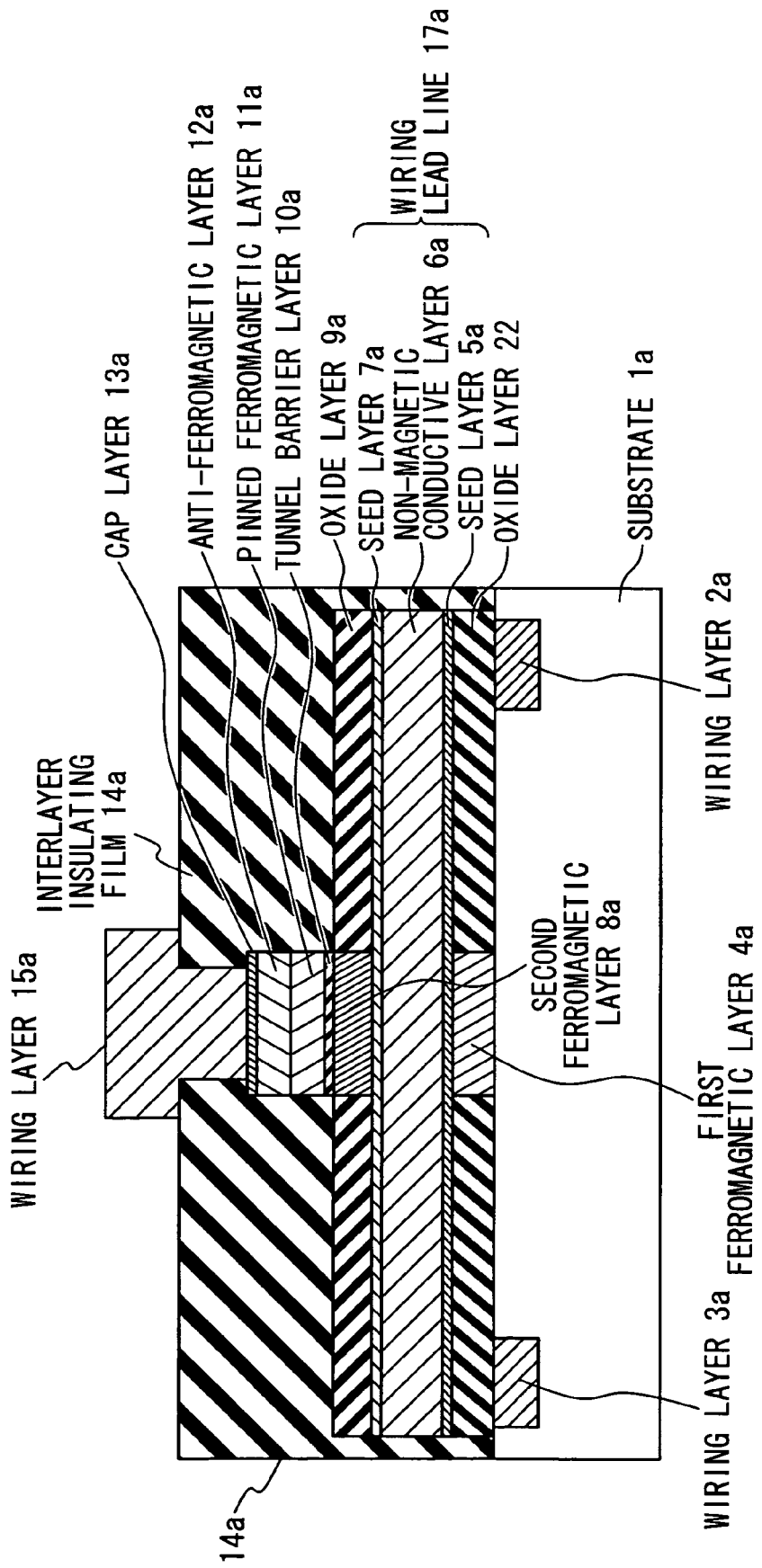
FIG. 10 is a cross sectional view showing the structure of the MRAM according to a second embodiment of present invention.

Referring to FIG. 10, the MRAM according to the second embodiment of the present invention contains a substrate 1a. Transistors (not shown) are formed on the substrate 1a. A wiring layer 2a and a wiring layer 3a are provided in the substrate 1a to extend in Y direction while keeping a distance and are connected with the transistor (not shown).

Supposing that the Z direction perpendicular to the substrate 1a is an upper direction, a first ferromagnetic layer 4a and an oxide layer 22 are formed on the substrate 1a. The first ferromagnetic layer 4a and the oxidized layer 22 form a flat layer as a unit.

A wiring lead line 17a is formed on the first ferromagnetic layer 4a and the oxide layer 22. The wiring lead line 17a is connected with the wiring layer 2a and the wiring layer 3a. The wiring lead line 17a contains a seed layer 5a, a non-magnetic conductive layer 6a and a seed layer 7a in order from the side of the substrate 1a.

A MTJ device 16a is formed on the wiring lead line 17a. The MTJ device 16a is formed in such a manner that the cross section of the MTJ device 16a in the direction perpendicular to the Z direction is smaller slightly than that of the first ferromagnetic layer 4a. The MTJ device 16a contains a second ferromagnetic layer 8a, a tunnel barrier layer 10a, a pinned ferromagnetic layer 11a, and an anti-ferromagnetic layer 12a in order from the side of the substrate 1a.

The side surface of the second ferromagnetic layer 8a is covered by an oxide layer 9a which is formed on the position corresponding to the second ferromagnetic layer 8a in the Z direction. The second ferromagnetic layer 8a and the oxide layer 9a form a substantially flat layer as a unit.

The side surfaces of the tunnel barrier layer 10a, the pinned ferromagnetic layer 11a and the anti-ferromagnetic layer 12a are covered by an interlayer insulating film 14a. A cap layer 13a is formed on the MTJ device 16a. The surface of the cap layer 13a is connected to a wiring layer 15a via a through-hole 19a. The wiring layer 15a is grounded.

The position relation of the first ferromagnetic layer 4a and the MTJ device 16a is the same as in the first embodiment shown in FIG. 4, viewing the MRAM from the Z direction. The MRAM having such a structure is used for the circuit shown in the FIG. 7, as in the first embodiment, and carries out the read and write operations, as in the first embodiment.

Next, the method of manufacturing the MRAM in the second embodiment will be described with reference to the drawings.

Figure 11A:
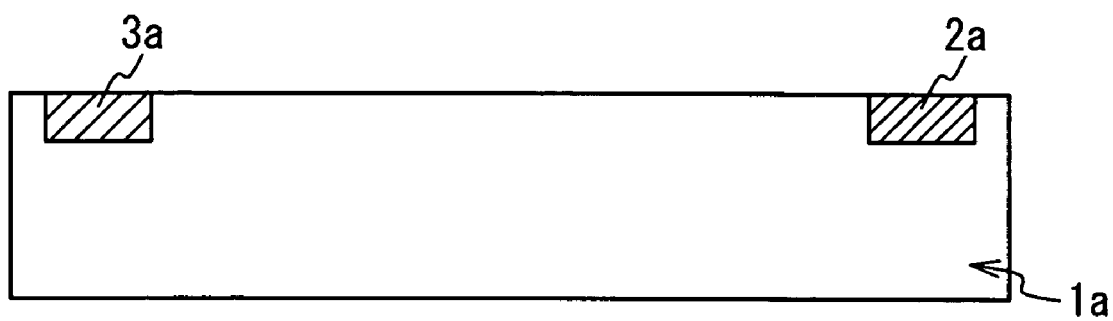
FIGS. 11A to 11K are cross sectional views showing the MRAM according to the second embodiment of the present invention in the manufacturing processes.

As shown in FIG. 11A, the wiring layer 2a and the wiring layer 3a are formed in the substrate 1a on which the transistor (not shown) is formed. The wiring layer 2a and the wiring layer 3a are connected with the transistor formed on the substrate 1a.

Figure 11B:
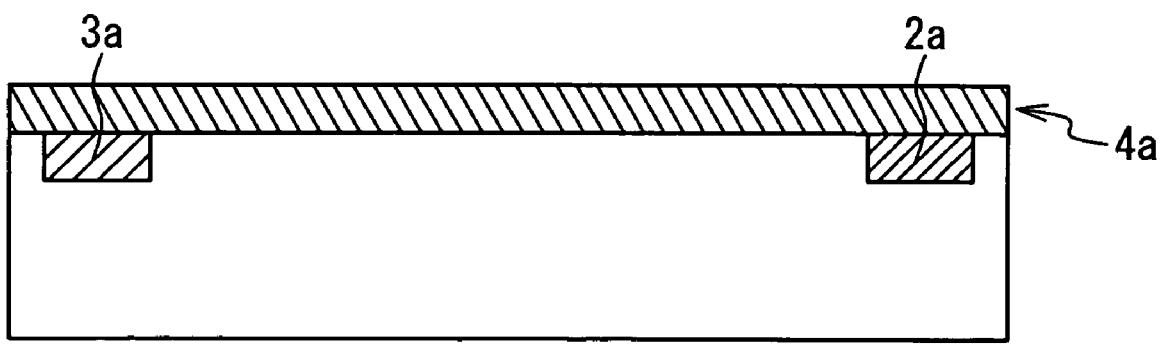
Figure 11C:
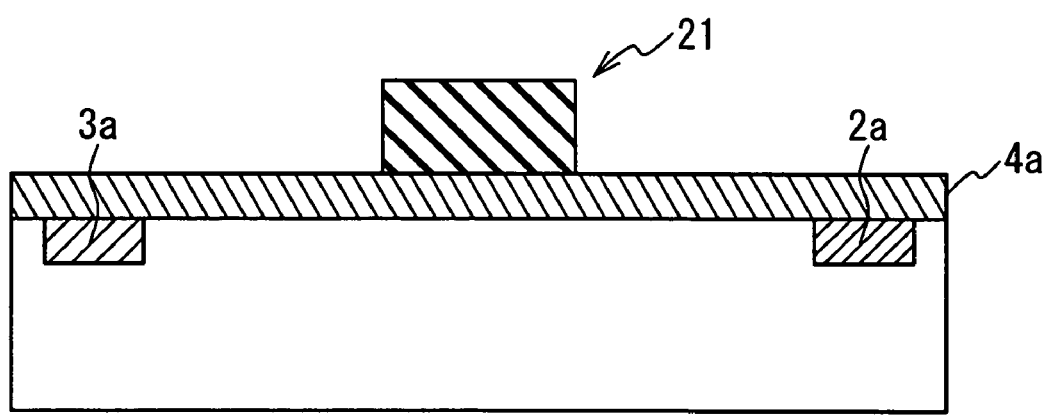
Figure 11D:
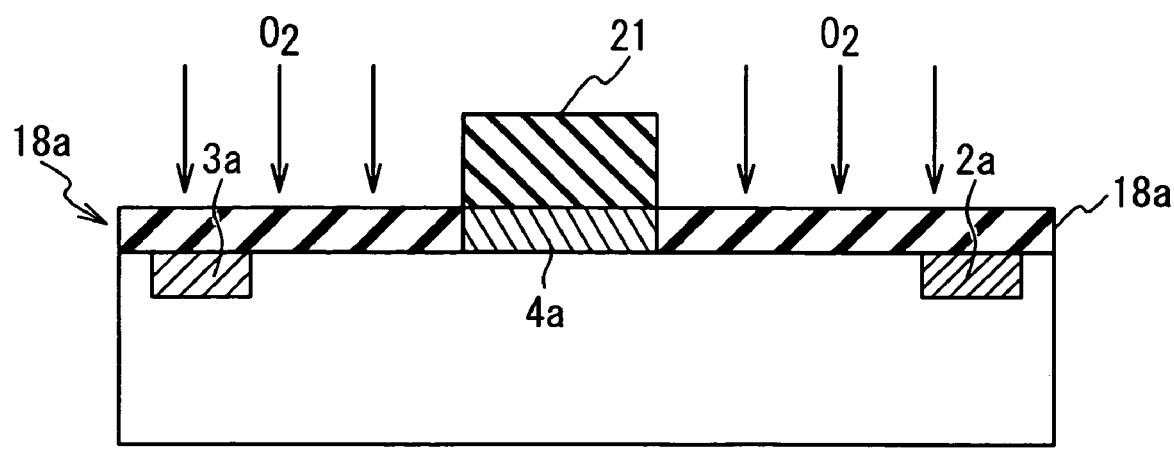

Next, as shown in FIG. 11B, the first ferromagnetic layer 4a is deposited and patterned on the substrate 1a. Subsequently, as shown in FIG. 11C, a mask 21 is formed on the first ferromagnetic layer 4a to have a predetermined shape. Subsequently, as shown in FIG. 11D, a part of the first ferromagnetic layer 4 is oxidized by using the mask 21, so that the part is non-magnetized. Thus, the oxide layer 22 is formed. Then, the mask 21 is removed.

Figure 11E:
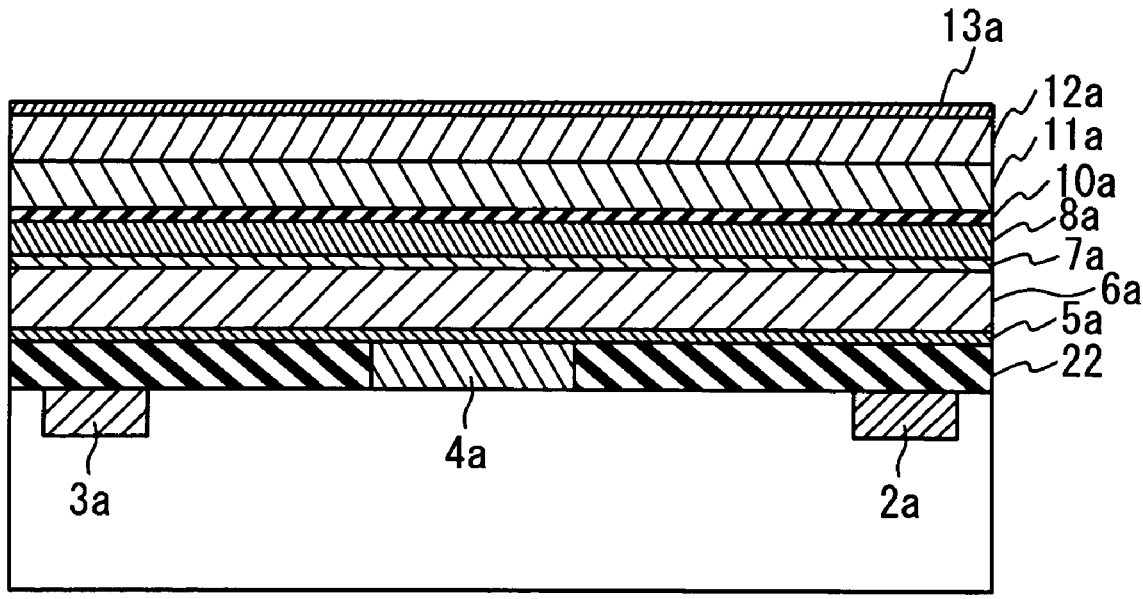

Next, as shown in FIG. 11E, on the first ferromagnetic layer 4a and the oxidized first ferromagnetic layer 22, the seed layer 5a, the non-magnetic conductive layer. 6a, the seed layer 7a, the second ferromagnetic layer 8a, the tunnel barrier layer 10a, the pinned ferromagnetic layer 11a, the anti-ferromagnetic layer 12a and the cap layer 13a are formed in order.

Figure 11F:
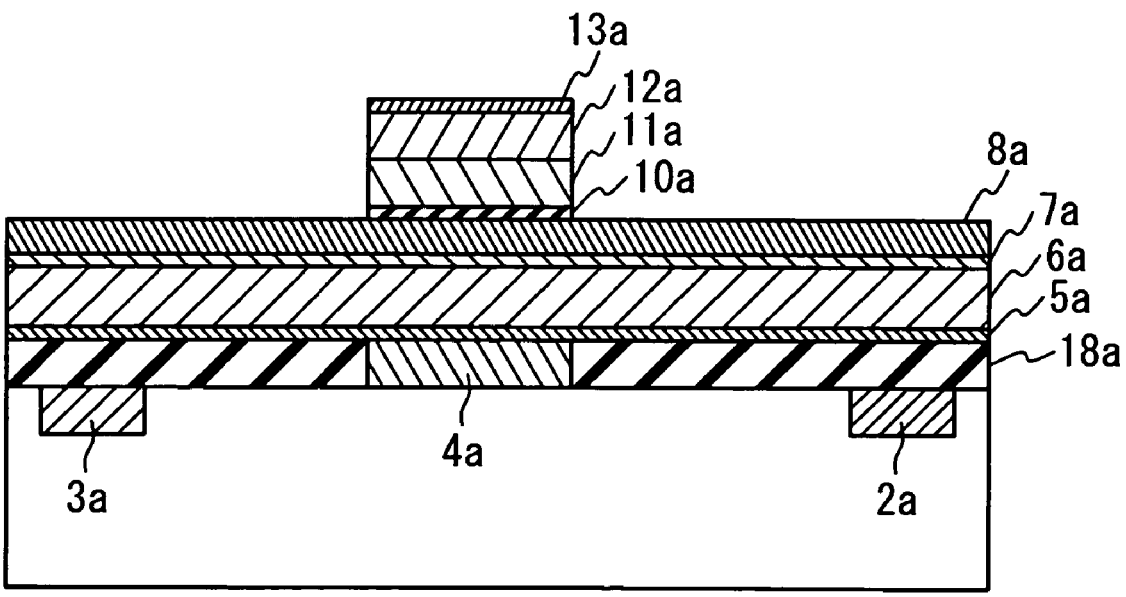

Next, as shown in FIG. 11F, a patterning is carried out in such a manner that the areas of the tunnel barrier layer 10a, the pinned ferromagnetic layer 11a, the anti-ferromagnetic layer 12a and the cap layer 13a in the MTJ device 16a in the cross section parallel to the substrate 1a are smaller than the area of the first magnetic layer 4a in the cross section parallel to the substrate 1a. When the MTJ device 16a is patterned, the flattening process which is conventionally carried out to prevent the MTJ device 16 from stepping out from the first ferromagnetic layer 4 is unnecessary, because the oxide layer 22 and the first ferromagnetic layer 4a are formed as a single flat film. As a result, the damage applied on the first ferromagnetic layer reduces.

Figure 11G:
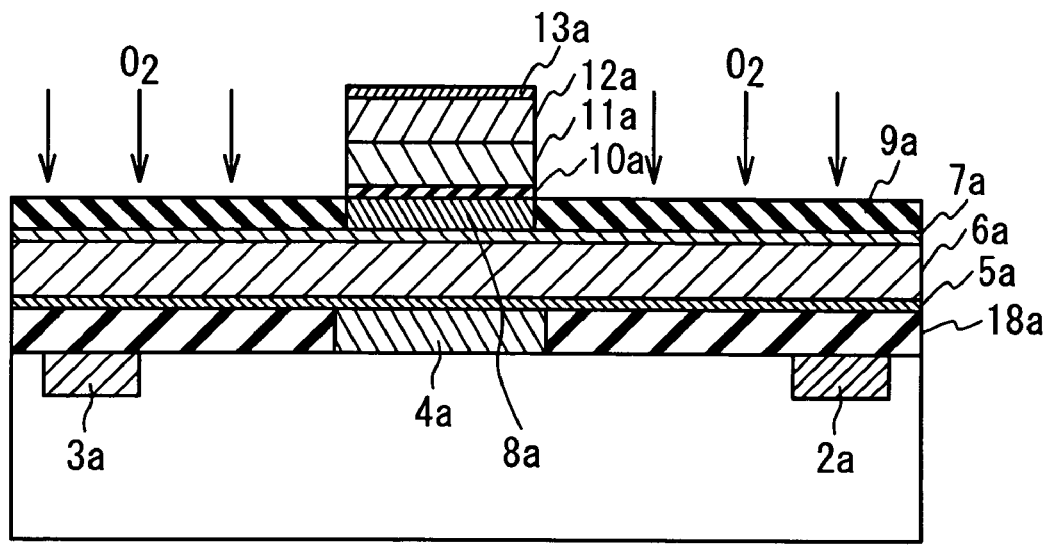
Figure 11H:
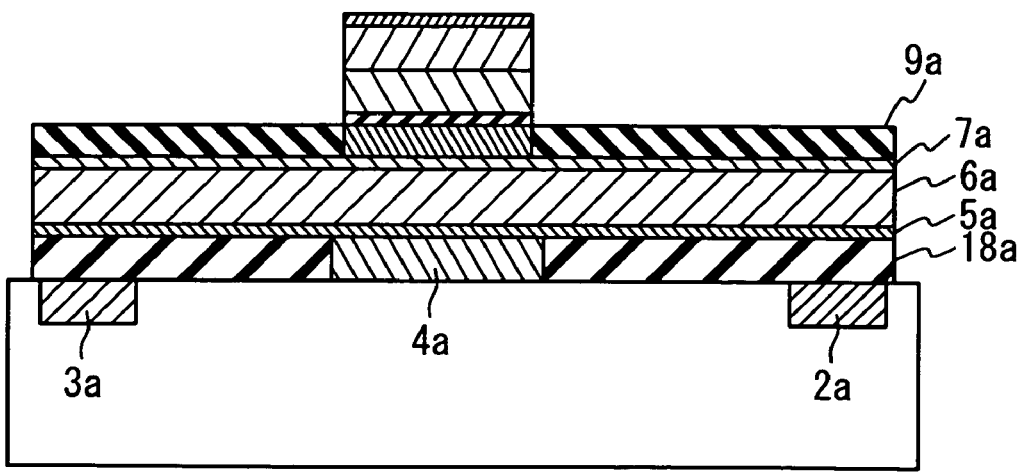

Next, as shown in FIG. 11G, oxygen plasma or oxygen radicals are irradiated to a part of the second ferromagnetic layer 8a which is not covered by the tunnel barrier layer 10a so that the part is oxidized. As a result, the oxidized layer 9a is formed. Subsequently, as shown in FIG. 11H, the wiring lead line 17a is patterned to have a predetermined shape.

Figure 11I:
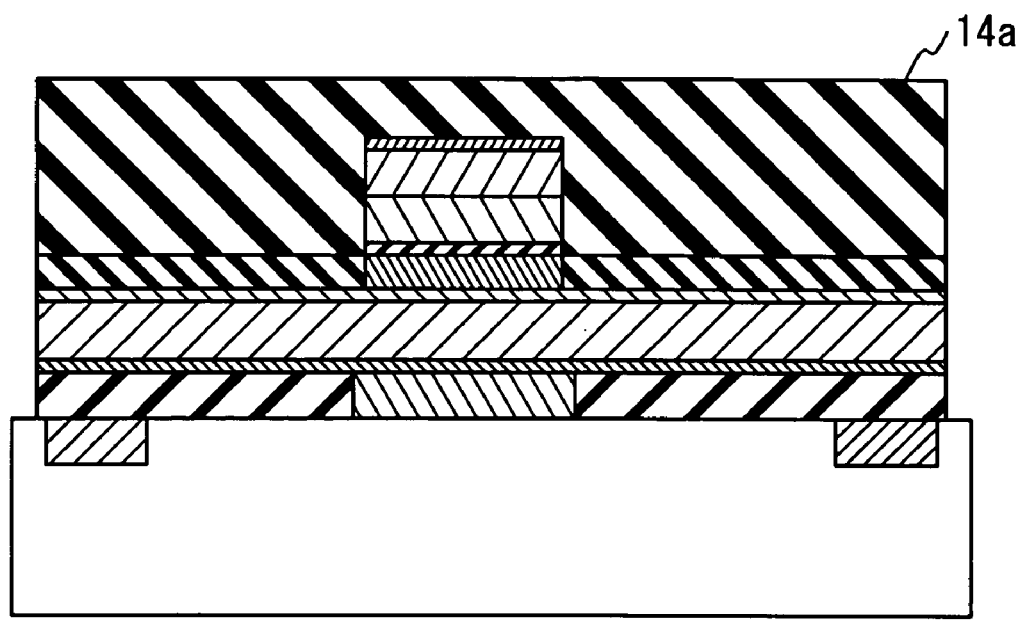
Figure 11J:
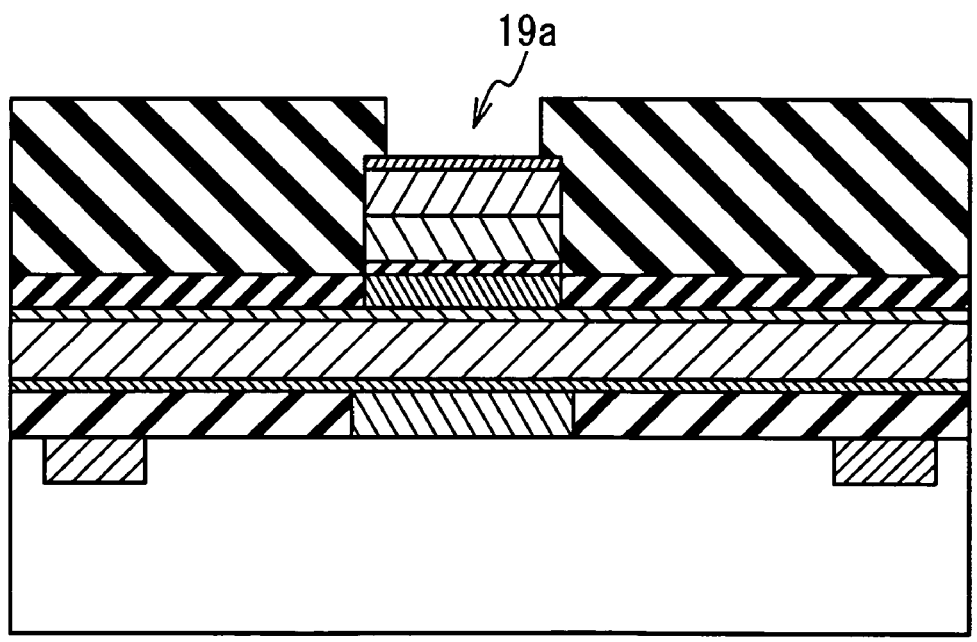
Figure 11K:
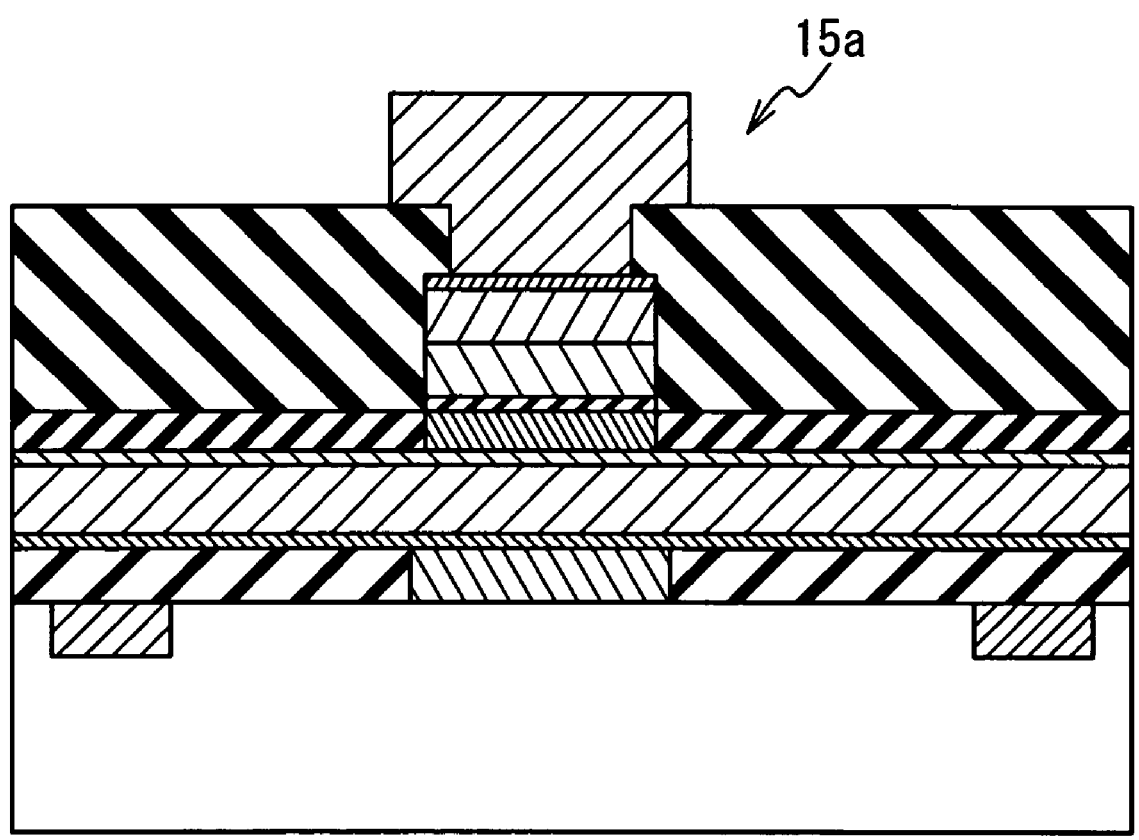

Next, as shown in FIG. 11I, the interlayer insulating film 14a is deposited. Subsequently, as shown in FIG. 11J, the through-hole 19a is formed in the interlayer insulating film 14a such that the cap layer 13a of the MTJ device 16a can be directly contacted from the outside of the interlayer insulating film 14a. Subsequently, as shown in FIG. 11K, the wiring layer 15a is formed on the cap layer 19a.

According to the manufacturing method of such an MRAM, the same effect as the first embodiment can be effectively achieved to restrain a deviation in device characteristics which is caused by shift of the first ferromagnetic layer 4a and the second ferromagnetic layer 8a. Moreover, in the MRAM manufactured by such a manufacturing method, because the first ferromagnetic layer 4a and the oxide layer 22 are formed on the substrate 1a without any step, the effect that the process margin in the photolithography process spreads is also achieved.

[Third Embodiment]

In the MRAM according to the third embodiment of the present invention, the MTJ device is formed on the substrate, and the first ferromagnetic layer is formed on the MTJ device, while in the MRAM of the first embodiment, the first ferromagnetic layer is formed on the substrate and the MTJ device is formed on the first ferromagnetic layer.

Figure 12:
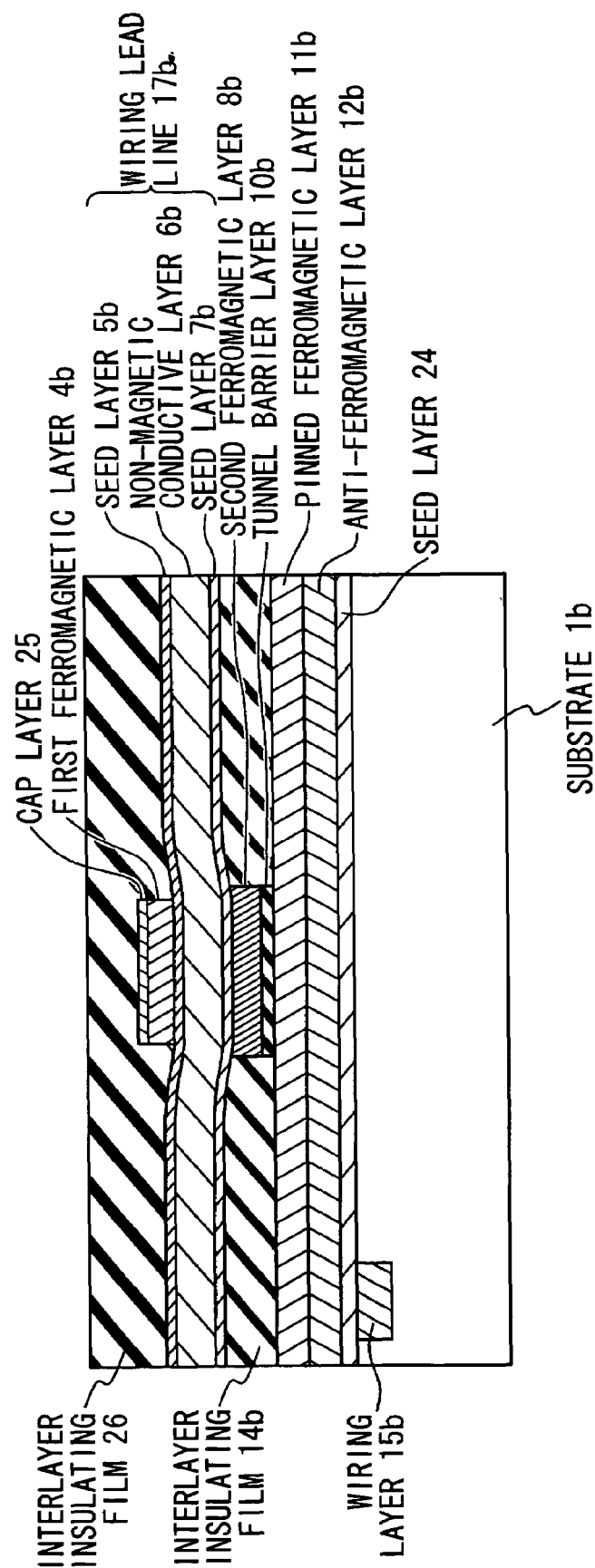
FIG. 12 is a cross sectional view showing the structure of the MRAM according to a third embodiment of the present invention.

As shown in FIG. 12, the MRAM of the third embodiment has a substrate 1b. Transistors (not shown) are formed on the substrate 1b. A seed layer 24, an anti-ferromagnetic layer 12b, a pinned ferromagnetic layer 11b, a tunnel barrier layer 10b, a second ferromagnetic layer 8b, a wiring lead line 17b, a first ferromagnetic layer 4b, cap layer 25 and an interlayer insulating film 26 are formed in order on the substrate 1b.

The side surface of the tunnel barrier layer 10b and the side surface of the second ferromagnetic layer 8b are covered by an interlayer insulating film 14b. The side surface of the first ferromagnetic layer 4b, and the side surface and upper surface of the cap layer 25 are covered by the interlayer insulating film 14b. The wiring lead line 17b is composed of a seed layer 7b, a non-magnetic conductive layer 6b and a seed layer 5b in order from the side of the substrate 1b.

The area of the first ferromagnetic layer 4b in the cross section parallel to the substrate 1b is smaller than the area of the second ferromagnetic layer 8b in the cross section parallel to the substrate 1b.

The MRAM which has such a structure carries out the same operation as in the first embodiment, as could be understood from correspondence relation in reference numerals.

Figure 13A:
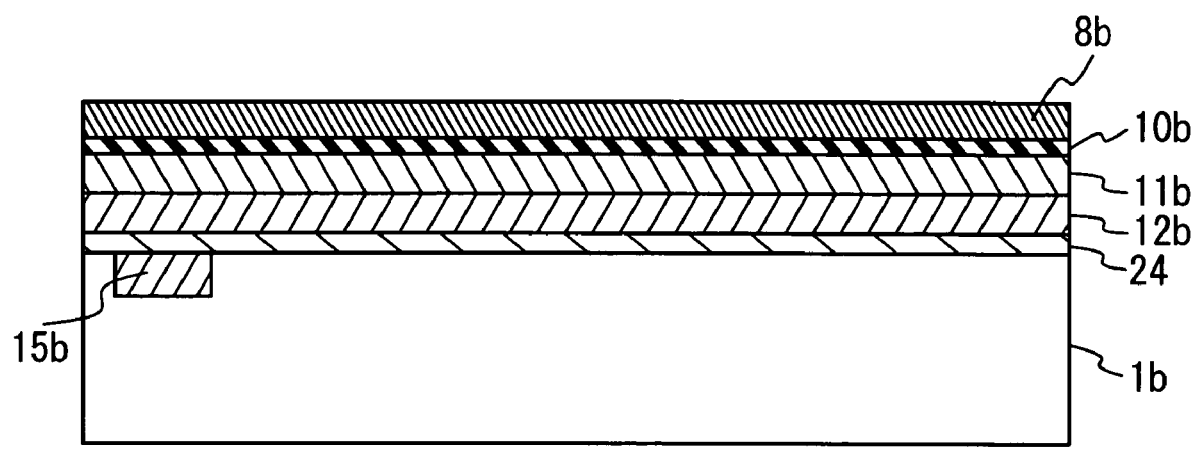
FIGS. 13A to 13F are cross sectional views showing the MRAM according to the third embodiment of the present invention in the manufacturing processes.

The method of manufacturing such an MRAM is shown in FIGS. 13A to 13F. As shown in FIG. 13A, the wiring layer 15 is formed in the substrate 1b that a transistor (not illustrated) is formed. The seed layer 24, the anti-ferromagnetic layer 12b, the pinned ferromagnetic layer 11b, the tunnel barrier layer 10b and the second ferromagnetic layer 8b are formed on the substrate 1b in this order.

Figure 13B:
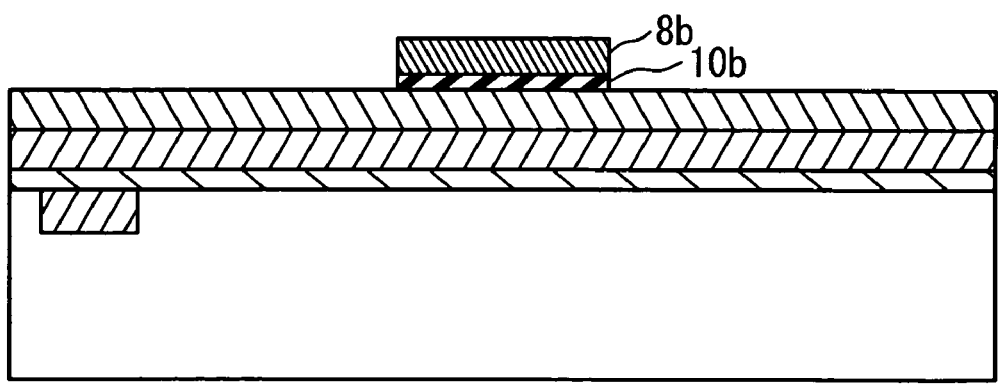
Figure 13C:
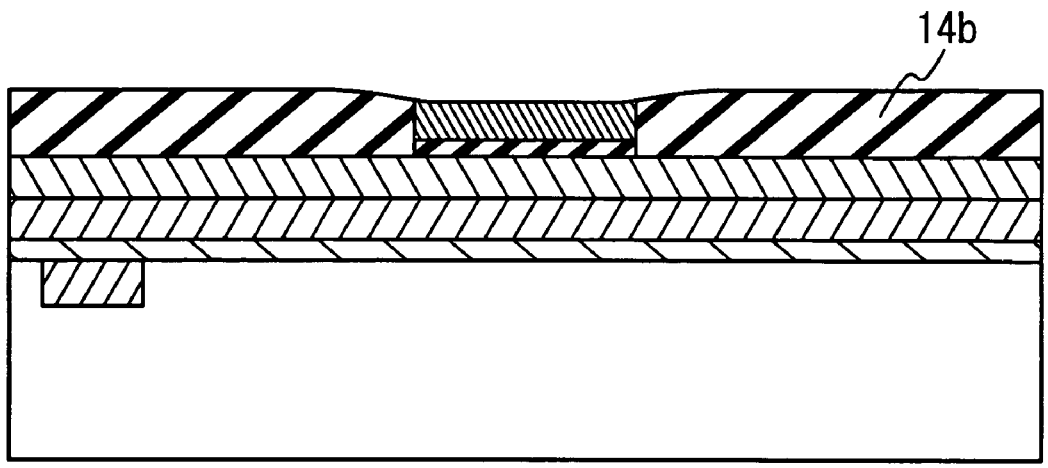

Next, as shown in FIG. 13B, the tunnel barrier layer 10b and the second ferromagnetic layer 8b are patterned to have a predetermined shape. Subsequently, as shown in FIG. 13C, the interlayer insulating film 14b is formed to cover a part where the tunnel barrier layer 10b is not formed, i.e., the upper and side surfaces of the second ferromagnetic layer 8b, the side surface of the tunnel barrier layer 10b, and the upper surface of the pinned ferromagnetic layer 11b. Also, a part of the interlayer insulating film 14b is removed by a lift-off method, an etching-back method or an etching method, so as to form a through-hole on the second ferromagnetic layer 8b.

Figure 13D:
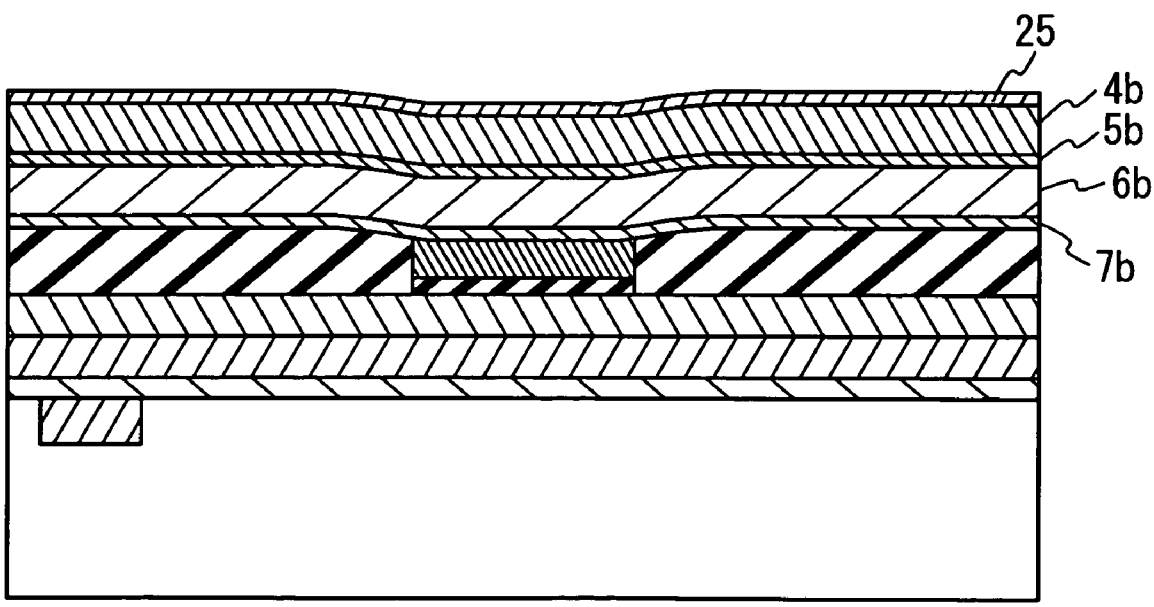

Next, as shown in FIG. 13D, the seed layer 7b, the non-magnetic conductive layer 6b, the seed layer 5b, the first ferromagnetic layer 4b and the cap layer 25 are formed in this order to cover the surface of the interlayer insulating film 14b and the surface of the second ferromagnetic layer 8b.

Figure 13E:
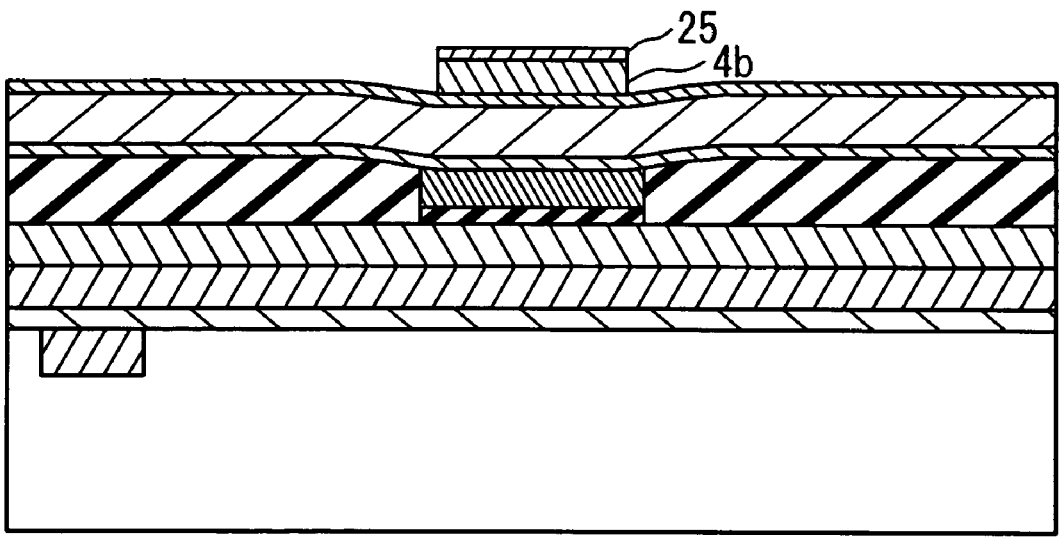

Next, as shown in FIG. 13E, the first ferromagnetic layer 4b and the cap layer 25 are patterned to have a predetermined shape. It is desirable that the cross section of the first ferromagnetic layer 4b in parallel to the substrate 1b has an analogous shape to the cross section of the second ferromagnetic layer 8b in parallel to the substrate 1b and is slightly smaller in the area than it.

Figure 13F:
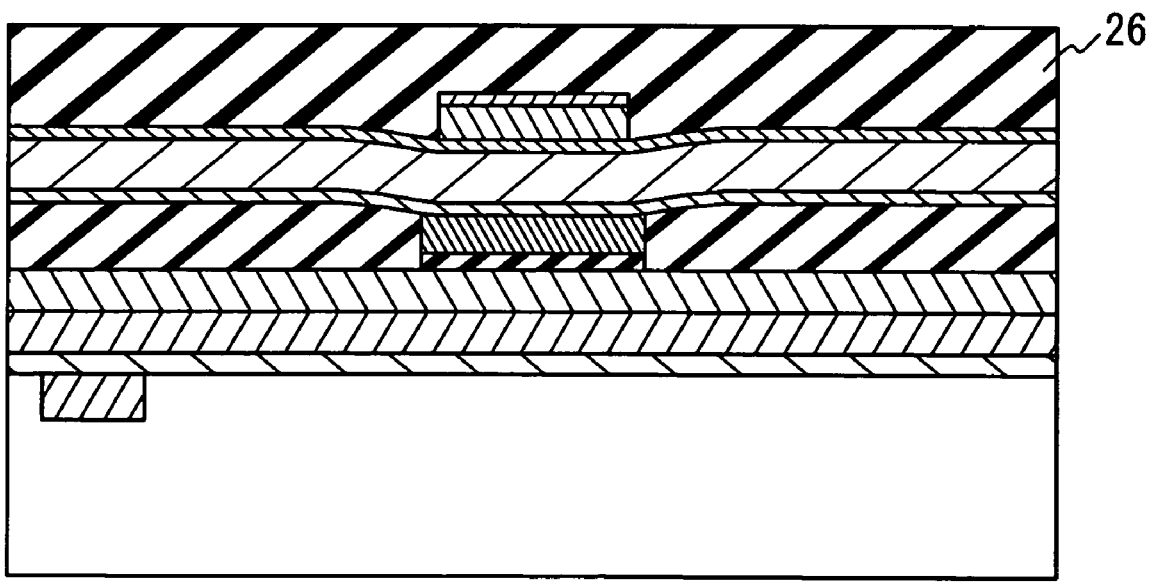

Next, as shown in FIG. 13F, the interlayer insulating film 26 is formed to cover a part where the first ferromagnetic layer 4b is not formed, i.e., the upper and side surfaces of the cap layer 25 and the side surface of the first ferromagnetic layer 4b and the upper surface of the seed layer 5b.

In the MRAM having such a structure, because the pinned ferromagnetic layer 11b is formed under the MTJ device on the side of the substrate 1b, it is easy to control the film characteristic of the pinned ferromagnetic layer 11b. Because the areas of the first ferromagnetic layer 4b and the second ferromagnetic layer 8b are different, the deviation in the characteristic of the device can be suppressed, like the first embodiment and the second embodiment.

Although the wiring layers are formed in the substrate, they may be formed on the substrate.

According to the MRAM and the manufacturing method of the present invention, the deviation of the device characteristic can be made small while the direction of the magnetization of the free ferromagnetic layer in case of the non-write operation can be stabilized.

Moreover, according to the present invention, it is possible to write data in the small current and the MRAM can be provided in a low cost.

What is claimed is:

1. A magnetic random access memory comprising:
   a substrate;
   a first ferromagnetic layer;
   a magnetic tunnel junction (MTJ) device provided on a same side of said substrate as said first ferromagnetic layer; and
   a wiring layer provided between said first ferromagnetic layer and said MTJ device,
   wherein said MTJ device comprises a second ferromagnetic layer opposing to said wiring layer, and an area of a first perpendicular projection of said first ferromagnetic layer on said substrate and an area of a second perpendicular projection of said second ferromagnetic layer on said substrate are different, and one of said first and second perpendicular projections contains the other.

2. The magnetic random access memory according to claim 1, wherein when said first perpendicular projection is smaller in said area than said second perpendicular projection, a product of a thickness of said first ferromagnetic layer and a direction of a saturation magnetization of said first ferromagnetic layer is larger than a product of a thickness of said second ferromagnetic layer and a direction of a saturation magnetization of said second ferromagnetic layer, and when said first perpendicular projection is larger in said area than said second perpendicular projection, a product of a thickness of said first ferromagnetic layer and a direction of a saturation magnetization of said first ferromagnetic layer is smaller than a product of a thickness of said second ferromagnetic layer and a direction of a saturation magnetization of said second ferromagnetic layer.

3. The magnetic random access memory according to claim 1, wherein said first ferromagnetic layer is provided between said substrate and said MTJ device.

4. The magnetic random access memory according to claim 1, wherein said MTJ device is provided between said substrate and said first ferromagnetic layer.

5. The magnetic random access memory according to claim 1, wherein said area of said first perpendicular projection is larger than that of said second perpendicular projection.

6. The magnetic random access memory according to claim 1, wherein said second ferromagnetic layer is provided between said substrate and said first ferromagnetic layer, and said second perpendicular projection is larger in said area than said first perpendicular projection.

7. The magnetic random access memory according to claim 1, wherein at least one of said first ferromagnetic layer and said second ferromagnetic layer and a non-magnetic layer adjacent to said at least one ferromagnetic layer form a substantially flat layer.

8. A magnetic random access memory comprising:
a substrate;
a first ferromagnetic layer;
a magnetic tunnel junction (MTJ) device provided on a same side of said substrate as said first ferromagnetic layer; and
a wiring layer provided between said first ferromagnetic layer and said MTJ device,
wherein said MTJ device comprises a second ferromagnetic layer opposing to said wiring layer, and said first ferromagnetic layer and said second ferromagnetic layer are provided such that a magneto-static combination between them is made smaller than a magneto-static combination between them when a first area of a first perpendicular projection of said first ferromagnetic layer on said substrate and a second area of a second perpendicular projection of said second ferromagnetic layer on said substrate are substantially same.

9. A magnetic random access memory comprising: a substrate; a first ferromagnetic layer formed on said substrate; a wiring lead line formed on said first ferromagnetic layer; and a magnetic tunnel junction (MTJ) device formed on said wiring lead line on a position corresponding to said first ferromagnetic layer, wherein a first area of a first perpendicular projection of said first ferromagnetic layer and a second area of a second perpendicular projection of said magnetic tunnel junction device are different.

10. The magnetic random access memory according to claim 9, wherein an area of said first ferromagnetic layer in a cross section parallel to said substrate is larger than an area of said magnetic tunnel junction device in a cross section parallel to said substrate.

11. The magnetic random access memory according to claim 9, wherein said magnetic tunnel junction device comprises: a second ferromagnetic layer connected with said wiring lead line, and a side surface of said second ferromagnetic layer is connected with an oxide layer.

12. The magnetic random access memory according to claim 9, wherein a side surface of said first ferromagnetic layer is connected with an oxide layer.

13. A magnetic random access memory comprising: a substrate; a magnetic tunnel junction (MTJ) device formed on said substrate; a wiring lead line formed on said magnetic tunnel junction device; and a first ferromagnetic layer formed on said wiring lead line on a position corresponding to said magnetic tunnel junction device, wherein a first area of a first perpendicular projection of said first ferromagnetic layer and a second area of a second perpendicular projection of said magnetic tunnel junction device are different.

* * * * *

UNITED STATES PATENT AND TRADEMARK OFFICE
CERTIFICATE OF CORRECTION

PATENT NO.        : 7,238,540 B2
APPLICATION NO.   : 10/873269
DATED             : July 3, 2007
INVENTOR(S)       : Hiroaki Honjo It is certified that error appears in the above-identified patent and that said Letters Patent is hereby corrected as shown below:

Col. 6, lines 63-67, Col. 7, lines 1-3 delete "The present invention relates to a U.S. patent application Ser. No. 11/208,370 by K. MORI, T. SUZUKI, Y. FUKUMOTO, and S. MIURA, titled "MAGNETIC MEMORY ADOPTING SYNTHETIC ANTIFERROMAGNET AS FREE MAGNETIC LAYER" and claiming priority based on Japanese patent Application No. JP-2004-240046. The disclosure of the U.S. Patent Application is incorporated herein by reference.", insert --The present invention relates to a U.S. Patent Application No. 10/496,826 by H. MATSUDERA and T. SUZUKI, titled "MAGNETIC RANDOM ACCESS MEMORY AND METHOD OF MANUFACTURING THE SAME" and claiming priority based on Japanese patent Application No. JP 2002-317527. The disclosure of the US Patent Application is incorporated herein by reference.--

Signed and Sealed this

Second Day of September, 2008

JON W. DUDAS
*Director of the United States Patent and Trademark Office*